(12) United States Patent
Ting et al.

(10) Patent No.: US 8,395,415 B2
(45) Date of Patent: Mar. 12, 2013

(54) ENHANCED PERMUTABLE SWITCHING NETWORK WITH MULTICASTING SIGNALS FOR INTERCONNECTION FABRIC

(75) Inventors: Benjamin S. Ting, Saratoga, CA (US); Peter M. Pani, Mountain View, CA (US)

(73) Assignee: Advantage Logic, Inc., Cupertino, CA (US)

( * ) Notice: Subject to any disclaimer, the term of this patent is extended or adjusted under 35 U.S.C. 154(b) by 61 days.

(21) Appl. No.: 13/179,342

(22) Filed: Jul. 8, 2011

(65) Prior Publication Data

US 2011/0267104 A1    Nov. 3, 2011

Related U.S. Application Data

(63) Continuation of application No. 12/491,089, filed on Jun. 24, 2009, now Pat. No. 7,999,570.

(51) Int. Cl.
*H01L 25/00* (2006.01)
(52) U.S. Cl. ............................. 326/41; 326/47
(58) Field of Classification Search .............. 326/37–41, 326/47
See application file for complete search history.

(56) References Cited

U.S. PATENT DOCUMENTS

| | | | |
|---|---|---|---|
| 4,020,469 A | 4/1977 | Manning |
| 4,661,901 A | 4/1987 | Veneski |
| 4,700,187 A | 10/1987 | Furtek |
| 4,720,780 A | 1/1988 | Dolecek |
| 4,736,333 A | 4/1988 | Mead et al. |
| 4,758,745 A | 7/1988 | Elgamal |
| 4,815,003 A | 3/1989 | Putatunda et al. |
| 4,847,612 A | 7/1989 | Kaplinsky |
| 4,870,302 A | 9/1989 | Freeman |
| 4,912,342 A | 3/1990 | Wong et al. |
| 4,918,440 A | 4/1990 | Furtek |
| 4,935,734 A | 6/1990 | Austin |
| 4,992,680 A | 2/1991 | Benedetti et al. |
| 5,122,685 A | 6/1992 | Chan |
| 5,144,166 A | 9/1992 | Camarota et al. |
| 5,187,393 A | 2/1993 | Elgamal et al. |
| 5,204,556 A | 4/1993 | Shankar |

(Continued)

FOREIGN PATENT DOCUMENTS

| | | |
|---|---|---|
| EP | 415542 | 3/1991 |
| EP | 0630115 | 6/1994 |

(Continued)

OTHER PUBLICATIONS

Altera Corporation Data Sheet, Flex EPF81188 12,000 Gate Programmable Logic Device, Sep. 1992, Ver. 1, pp. 1-20.

(Continued)

*Primary Examiner* — Jason M Crawford
(74) *Attorney, Agent, or Firm* — Lowenstein Sandler LLP

(57) ABSTRACT

An integrated circuit having an L-level permutable switching network (L-PSN) comprising L levels of intermediate conductors and (L+2) levels of conductors for L at least equal to one. At least an (i−1)-th level of conductors of the L-PSN comprising $I_{i-1}$ number of conductors selectively couple to the i-th level of conductors comprising $I_i$ number of conductors which comprise of D[i] sets of conductors in the L-PSN, where i is selected from [1:L+1], through $((I_{i-1} \times D[i]) + I_i)$ number of switches where each conductor of the $I_{i-1}$ number of conductors selectively couples to at least (D[i]+1) number of conductors of the $I_i$ number of conductors, at least one conductor from each of the D[i] sets of conductors, for D[i] greater than one. The integrated circuit can be used in various electronic devices.

9 Claims, 13 Drawing Sheets

U.S. PATENT DOCUMENTS

| | | | |
|---|---|---|---|
| 5,208,491 | A | 5/1993 | Ebeling et al. |
| 5,221,865 | A | 6/1993 | Phillips et al. |
| RE34,363 | E | 8/1993 | Freeman |
| 5,243,238 | A | 9/1993 | Kean |
| 5,256,918 | A | 10/1993 | Suzuki |
| 5,260,610 | A | 11/1993 | Pederson et al. |
| 5,260,611 | A | 11/1993 | Cliff et al. |
| 5,296,759 | A * | 3/1994 | Sutherland et al. ............. 326/47 |
| 5,298,805 | A | 3/1994 | Garverick et al. |
| 5,329,470 | A | 7/1994 | Sample et al. |
| 5,349,691 | A | 9/1994 | Harrison et al. |
| 5,369,314 | A | 11/1994 | Patel et al. |
| 5,376,844 | A | 12/1994 | Pedersen et al. |
| 5,396,126 | A | 3/1995 | Britton et al. |
| 5,406,525 | A | 4/1995 | Nicholes |
| 5,444,394 | A | 8/1995 | Watson et al. |
| 5,455,525 | A | 10/1995 | Ho et al. |
| 5,457,410 | A | 10/1995 | Ting |
| 5,469,003 | A | 11/1995 | Kean |
| 5,477,067 | A | 12/1995 | Isomura et al. |
| 5,485,103 | A | 1/1996 | Pedersen et al. |
| 5,519,629 | A | 5/1996 | Snider |
| 5,537,057 | A | 7/1996 | Leong et al. |
| 5,550,782 | A | 8/1996 | Cliff et al. |
| 5,552,722 | A | 9/1996 | Kean |
| 5,572,148 | A | 11/1996 | Lytle et al. |
| 5,581,199 | A | 12/1996 | Pierce et al. |
| 5,581,767 | A | 12/1996 | Katsuki et al. |
| 5,598,109 | A | 1/1997 | Leong et al. |
| 5,815,004 | A | 9/1998 | Trimberger et al. |
| 5,818,254 | A | 10/1998 | Agrawal et al. |
| 5,825,202 | A | 10/1998 | Tavana |
| 5,835,405 | A | 11/1998 | Tsui et al. |
| 5,841,775 | A | 11/1998 | Huang |
| 5,850,564 | A | 12/1998 | Ting et al. |
| 5,880,597 | A | 3/1999 | Lee |
| 5,883,526 | A | 3/1999 | Reddy et al. |
| 5,894,228 | A | 4/1999 | Reddy |
| 5,903,165 | A | 5/1999 | Jones et al. |
| 5,914,616 | A | 6/1999 | Young |
| 6,016,063 | A | 1/2000 | Trimberger |
| 6,034,547 | A | 3/2000 | Pani et al. |
| 6,038,627 | A | 3/2000 | Plants |
| 6,051,991 | A | 4/2000 | Ting |
| 6,088,526 | A | 7/2000 | Ting et al. |
| 6,160,420 | A | 12/2000 | Gamal |
| 6,163,168 | A | 12/2000 | Nguyen et al. |
| 6,181,162 | B1 | 1/2001 | Lytle et al. |
| 6,292,022 | B2 | 9/2001 | Young |
| 6,417,694 | B1 | 7/2002 | Reddy et al. |
| 6,433,580 | B1 | 8/2002 | Ting |
| 6,507,217 | B2 | 1/2003 | Ting |
| 6,594,810 | B1 | 7/2003 | Reblewski et al. |
| 6,597,196 | B2 | 7/2003 | Ting |
| 6,670,825 | B1 | 12/2003 | Lane et al. |
| 6,686,768 | B2 | 2/2004 | Comer |
| 6,693,456 | B2 | 2/2004 | Wong |
| 6,747,482 | B2 | 6/2004 | Ting |
| 6,940,308 | B2 | 9/2005 | Wong |
| 6,975,139 | B2 | 12/2005 | Pani et al. |
| 7,065,076 | B1 | 6/2006 | Nemazie |
| 7,123,612 | B2 | 10/2006 | Lu |
| 7,142,012 | B2 | 11/2006 | Ting |
| 7,256,614 | B2 | 8/2007 | Pani et al. |
| 7,417,457 | B2 * | 8/2008 | Pani et al. ........................ 326/41 |
| 7,423,453 | B1 | 9/2008 | Ting |
| 7,557,613 | B2 | 7/2009 | Pani et al. |
| 7,705,629 | B1 | 4/2010 | Pani et al. |
| 7,714,611 | B1 | 5/2010 | Pani et al. |
| 7,768,302 | B2 | 8/2010 | Pani et al. |
| 7,777,519 | B2 | 8/2010 | Pani et al. |
| 2001/0007428 | A1 | 7/2001 | Young et al. |
| 2002/0186044 | A1 | 12/2002 | Agrawal et al. |
| 2007/0285126 | A1 | 12/2007 | Kaptanoglu |
| 2008/0272806 | A1 | 11/2008 | Pani et al. |
| 2009/0273368 | A1 | 11/2009 | Pani et al. |
| 2010/0134143 | A1 * | 6/2010 | Pani et al. ........................ 326/41 |
| 2010/0141298 | A1 | 6/2010 | Pani et al. |
| 2010/0156461 | A1 | 6/2010 | Pani et al. |
| 2010/0244895 | A1 | 9/2010 | Pani et al. |

FOREIGN PATENT DOCUMENTS

| | | |
|---|---|---|
| GB | 2180382 | 3/1987 |
| GB | 2295738 | 5/1996 |
| WO | WO92/08286 | 5/1992 |
| WO | WO94/10754 | 5/1994 |
| WO | WO94/28475 | 12/1994 |
| WO | WO95/04404 | 2/1995 |
| WO | WO95/28769 | 10/1995 |
| WO | WO96/05964 | 4/1996 |
| WO | WO96/35261 | 11/1996 |
| WO | WO03/032492 | 4/2003 |

OTHER PUBLICATIONS

ATEML Field Programmable Arrays, AT 6000 Series, 1993, pp. 1-16.

Britton et al., "Optimized Reconfigurable Cell Array Architecture for High-Performance Field Programmable Gate Arrays", Proceedings of the IEEE 1993 Custom Integrated Circuits Conference, 1993, pp. 7.2.1-7.2.5.

Buffoli, E., et al., "Dynamically Reconfigurable Devices Used to Implement a Self-Tuning High Performances PID Controller", 8/89 IEEE, pp. 107-112.

Bursky, D., "Fine-Grain FPGA Architecture Uses Four Levels of Configuration Hierarchy", 2328 Electronic Design, 41, No. 20, Cleveland, OH, Oct. 1, 1993, pp. 33-34.

Cliff et al., "A Dual Granularity and Globally Interconnected Architecture for a Programmable Logic Device", IEEE '93, pp. 7.3.1-7.3.5.

Devades, S., et al., "Boolean Decomposition of Programmable Logic Arrays", IEEE 1988, pp. 2.5.1-2.5.5.

Kaptanoglu, Sinan, et al., "A New High Density and Very Low Cost Reprogrammable FPGA Architecture", Actel Corporation, 10 pages. Document made public in Mar. 2004.

Krambeck, Robert H., "ORCA: A High Performance, Easy to Use SRAM Based Architecture", Wescon, Sep. 28-30, 1993, pp. 310-320.

Liu, D.L. et al., "Design of Large Embedded CMOS PLAs for Built-In Self-test", IEEE Transactions on Computed-Aided Design, vol. 7, No. 1, Jan. 1988, pp. 50-53.

Minnick, R.C., "A Survey of Microcellular Research", vol. 14, No. 2, Apr. 1967, pp. 203-241.

Motorola Project Brief, "MPA10xx Field Programmable Gate Arrays", Sep. 27, 1993, 2 pages.

Shoup, R.G., "Programmable Cellular Logic Arrays", Abstract, Ph.D. Dissertation, Carnegie Mellon University, Pittsburgh, Pennsylvania, Mar. 1970, pp. ii-121.

Spandorfer, L.M., "Synthesis of Logic Functions on an Array of Integrated Circuits", Contract No. AF 19(628)2907, Project No. 4645, Task No. 464504, Final Report, Nov. 30, 1965.

Sun, Y., et al., "An Area Minimizer for Floorplans with L-Shaped Regions", 1992 International Conference on Computer Design, 1992 IEEE, pp. 383-386.

Vidal, J.J., "Implementing Neural Nets with Programmable Logic", IEEE Transactions on Acoustic, Speech, and Signal Processing, vol. 36, No. 7, Jul. 1988, pp. 1180-1190.

Wang, P., et al., "A High Performance FPGA with Hierarchical Interconnection Structure", IEEE, May 30, 1994, pp. 239-242.

Xilinx, "The Programmable Gate Array Data Book", 1992, 386 pages.

Zlotnick, F., et al., "A High Performance Fine-Grained Approach to SRAM Based FPGAs", Wescon, Sep. 28-30, 1993, pp. 321-326.

Notice of Allowance mailed Dec. 10, 2009 for U.S. Appl. No. 12/327,702, filed Dec. 3, 2008, 8 pages.

Notice of Allowance mailed Sep. 30, 2010 for U.S. Appl. No. 12/720,138, filed Mar. 9, 2010, 9 pages.

Notice of Allowance mailed Dec. 10, 2009 for U.S. Appl. No. 12/327,704, filed Dec. 3, 2008, 8 pages.

Notice of Allowance mailed Jun. 7, 2010 for U.S. Appl. No. 12/703,624, filed Feb. 10, 2010, 8 pages.

Notice of Allowance mailed Nov. 12, 2010 for U.S. Appl. No. 12/491,089, 22 pages.

Notice of Allowance mailed Apr. 7, 2011 for U.S. Appl. No. 12/491,089, 22 pages.

PCT International Search Report and Written Opinion of the International Searching Authority for PCT/US09/58818 filed Sep. 29, 2009, mailed Nov. 25, 2009, 17 pages.

* cited by examiner

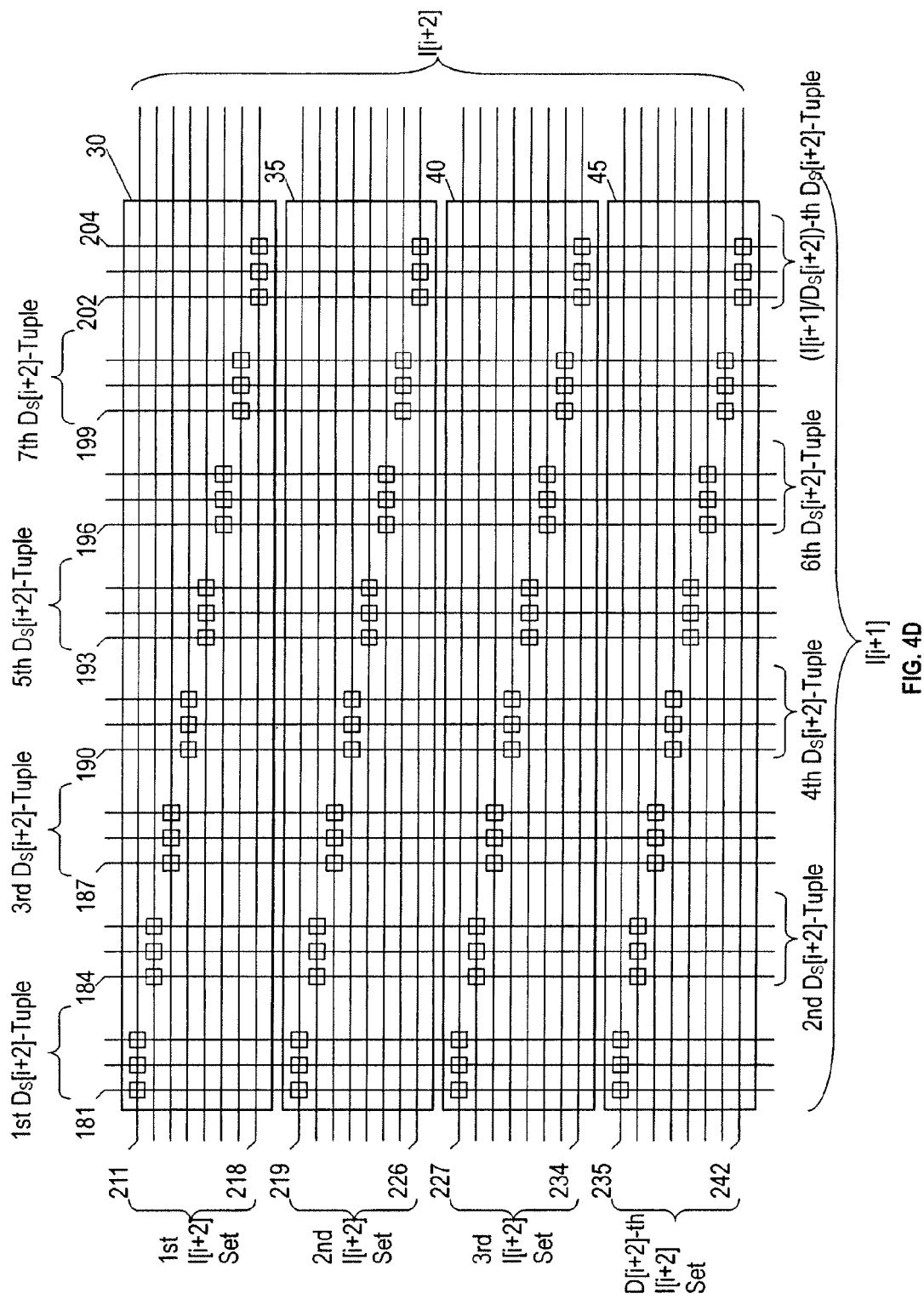

US 8,395,415 B2

ENHANCED PERMUTABLE SWITCHING NETWORK WITH MULTICASTING SIGNALS FOR INTERCONNECTION FABRIC

REFERENCE TO RELATED APPLICATIONS

This is a continuation of application Ser. No. 12/491,089, filed Jun. 24, 2009 now U.S. Pat. No. 7,999,570, which is hereby incorporated by reference.

TECHNICAL FIELD

Embodiments of this invention relate to switching networks used in an interconnection fabric and, in particular, can be used with programmable logic circuits.

BACKGROUND

A programmable logic circuit, also referred to as field programmable gate array (FPGA) is an off the shelf integrated logic circuit which can be programmed by the user to perform logic functions. Circuit designers define the desired logic functions and the circuit is programmed to process the signals accordingly. Depending on logic density requirements and production volumes, programmable logic circuits are superior alternatives in terms of cost and time to market. A typical programmable logic circuit is composed of logic cells where each of the logic cells can be programmed to perform logic functions on its input variables. Additionally, interconnect resources are provided throughout the programmable logic circuit which can be programmed to conduct signals from outputs of logic cells to inputs of logic cells according to user specification.

As technology progresses to allow for larger and more sophisticated programmable logic circuits, both the number of logic cells and the required interconnect resources increases in the circuit. Competing with the increased number of logic cells and interconnect resources is the need to keep the circuit size small. One way to reduce the required circuit size is to reduce the interconnect resources while maintaining a certain level of connectivity. Therefore, it can be seen that as the functionality implemented on the chip increases, the interconnection resources required to connect a large number of signals can be quickly exhausted. The trade-offs are either to provide for a lower utilization of logic cells in a circuit while keeping the circuit size small or to provide more routing resources that can increase the circuit size dramatically.

There has been steady attempts of using switching networks such as cross bar or Clos networks as the basis of an interconnection fabrics used in the field of programmable logic circuits. L. M. Spandorfer in 1965 describes possible implementation of a programmable logic circuit using neighborhood interconnection, and connections through multiple conductors using switches in a Clos network.

Reddy et al. in U.S. Pat. No. 6,417,694 discloses an architecture where inter-super-region, inter-region, and local conductors are used. A cross-bar scheme is used at the lowest level (using MUXs) for the local wires to have universal access to the inputs of the logic elements. Reddy et al. in U.S. Pat. No. 5,883,526 discloses various schemes having circuit reduction techniques in the local cross-bar.

Reblewski et al. in U.S. Pat. No. 6,594,810 describes an architecture building a programmable logic circuit using crossbar devices recursively. Wong in U.S. Pat. No. 6,693,456 and U.S. Pat. No. 6,940,308 use Benes switching networks as the interconnection fabric for programmable logic circuit.

At the base level of circuit hierarchy, multiple-input Look Up Table (LUT) logic cells are commonly used. There are two advantages in using a LUT as the base logic cell. One advantage is that the LUT allows programmable implementation of any Boolean functions having up to the multiple-input and one output. Another advantage is that the multiple inputs are interchangeable and logically equivalent. Hence, it does not matter which signal connecting to which input pin of the LUT for the LUT to function correctly as long as those signals connect to the respective inputs of the LUT.

A common problem to be solved in any programmable logic circuit is that of interconnectivity, namely, how to connect a first set of conductors or pins carrying signals to a second multiple sets of conductors to receive those signals where the logic cells originating the signals and the logic cells receiving the signals are spread over a wide area in an integrated circuit (i.e., M number of outputs from M or less number of logic cells where one or more outputs of each logic cells connects to inputs of one or more logic cells). A conventional solution is to use a cross bar switch where every conductor of the first set is connectable to every conductor in the second multiple sets of conductors directly through a switch. Unfortunately, this approach is impractical in most cases. Prior solutions in one degree or another try to divide the connectivity problem into multiple pieces using a divide and conquer strategy where local clusters of logic cells are interconnected and extended to other clusters of logic, either through extensions of local connections or using longer distance connections. These prior interconnect schemes are ad hoc and mostly based on empirical experiences. A desired routing model or interconnect architecture should enable or guarantee full connectivity for a large number of inputs and outputs over a large part of the circuit all the time.

U.S. Pat. Nos. 6,975,139, 7,256,614 and 7,417,457 by the present inventors describe one type of switching network (L-SN) of the conventional design in which the L-SN has (L+2) levels of conductors with L-level(s) of intermediate conductors of $I_i$ number of conductors including $D[i]$ sets of conductors for $i=[1:L]$, $L \geqq 1$ and $\Sigma_{i=[1:L+1]}(I_{i-1} \times D[i])$ number of switches where the 0-th level of pins or conductors of $I_0$ number of pins or conductors selectively couple to the (L+1)-th level of pins or conductors of $(D[L+1] \times \Pi_{j=[1:L]} D[j])$ number of pins or conductors including $D[L+1]$ sets of pins or conductors through the L level(s) of intermediate conductors and $\Sigma_{i=[1:L+1]}(I_{i-1} \times D[i])$ number of switches of the L-SN. A variable, $D_S[i]$ which is at least two, is defined as $D_S[i]=(I_{i-1}/I_i) \times D[i]$ for $i=[1:L+1]$. A $D_S[i]$-tuple is $D_S[i]$ number of conductors of the (i−1)-th level of conductors with the characteristics that the $D_S[i]$-tuple selectively couple to one conductor, through a respective $D_S[i]$ number of switches, in each of the $D[i]$ sets of conductors of the i-th level of conductors of the L-SN for $i=[1:L+1]$. Additionally, in the L-SN, the $I_{i-1}$ number of conductors of the (i−1)-th level can be organized into $(I_{i-1}/D_S[i])$ groups of $D_S[i]$-tuples for $i=[1:L+1]$.

Two related patent applications by the present inventors, U.S. patent application Ser. No. 12/327,702 and U.S. patent application Ser. No. 12/327,704, disclosed alternative L-PSN with different switch coupling schemes operating on conductors between two consecutive levels of conductors where the permutable switching network (L-PSN) having $\Pi_{j=[1:L+1]}(I_{j-1} \times D[j])$ number of switches and L-level(s) of intermediate conductors of $I_i$ number of conductors having $D[i]$ sets of conductors for $i=[1:L]$ to connect the 0-th level of pins or conductors of $I_0$ number of pins or conductors to the (L+1)-th level of pins or conductors of $(D[L+1] \times \Pi_{j=[1:L]} D[j])$ number of pins or conductors having $D[L+1]$ sets of pins or conductors through the L level(s) of intermediate conductors and $\Sigma_{j=[1:L+1]}(I_{j-1} \times D[j])$ number of switches of the L-PSN with different switch coupling schemes from the conventional L-SN for L>1.

U.S. patent application Ser. No. 12/327,704 uses the same $D_S[i]$-tuple definition in a L-PSN as those in the U.S. Pat. Nos. 6,975,139, 7,256,614 and 7,417,457. An L-PSN of this application uses the same $D_S[i]$-tuple definition having the coupling characteristics of the $D_S[i]$-tuples.

A weaker version of a $D_S[i]$-tuple, denoted as W-$D_S[i]$-tuple, is defined as $D_S[i]$ number of conductors of the (i−1)-th level of conductors which are selectively coupled to one conductor, through a respective $D_S[i]$ number of switches, in just one of the D[i] sets of conductors of the i-th level of conductors of the L-PSN for i=[1:L+1]. Thus a W-$D_S[i]$-tuple which are selectively coupled to one of the D[i] sets of the $I_i$ number of conductors can be different from any other W-$D_S[i]$-tuple which are selectively coupled to a different set of the D[i] sets of conductors.

The labels $I_{i-1}$, $I_i$, $D_S[i]$, D[i] in FIG. 1A, FIG. 1B and FIG. 1C denote two levels of conductors $I_{i-1}$ and $I_i$ with divider D[i] where $D_S[i]=D[i] \times (I_{i-1}/I_i)$ in a conventional L-SN or L-PSN switching network described in U.S. patent application Ser. No. 12/327,702 and U.S. patent application Ser. No. 12/327,704 by the present inventors. For example, the labels $I_{i-1}$, $I_i$, $D_S[i]$, D[i] in FIG. 1A, FIG. 1B and FIG. 1C can be treated to respectively corresponds to the notations $I_0$, $I_1$, $D_S[1]$, D[1] of a conventional L-SN and L-PSN in U.S. patent application Ser. No. 12/327,702 and U.S. patent application Ser. No. 12/327,704 if we set i=1. Thus in the discussions of the embodiments of FIG. 1A through FIG. 1C below, those notations above are interchangeable.

As an illustration of the conventional designs, FIG. 1A illustrates one embodiment of the switch couplings between two consecutive levels of conductors in the conventional L-SN of U.S. Pat. Nos. 6,975,139, 7,256,614 and 7,417,457 where L>0: the (i−1)-th level of conductors of $I_{i-1}$=32 number of conductors, [101:132], selectively couple to the i-th level of conductors of $I_i$=32 number of conductors including D[i]=4 sets of (intermediate) conductors, {[151:158], [159:166], [167:174], [175:182]}; not every conductor of $I_{i-1}$ or $I_i$ number of conductors are labeled in the embodiment of FIG. 1A, and for purpose of illustration, those conductors are assumed to be consecutively labeled. A $D_S[i]$-tuple of the embodiment of FIG. 1A is of size four which is the same as the divider D[i] in this embodiment. The $I_{i-1}$ conductors [101:132] are selectively coupled to the first set of $I_i$ conductors [151:158] through $I_{i-1}$ number of switches in 135; the $I_{i-1}$ conductors [101:132] are selectively coupled to the second set of $I_i$ conductors [159:166] through $I_{i-1}$ number of switches in 140, the $I_{i-1}$ conductors [101:132] are selectively coupled to the third set of $I_i$ conductors [167:174] through $I_{i-1}$ number of switches in 145 and the $I_{i-1}$ conductors [101:132] are selectively coupled to the D[i]-th set of $I_i$ conductors [175:182] through $I_{i-1}$ number of switches in 150.

FIG. 1B illustrates one embodiment of the switch couplings between two consecutive levels of conductors in the conventional L-PSN of U.S. patent application Ser. No. 12/327,704 where L>0: the (i−1)-th level of conductors of $I_{i-1}$=32 number of conductors, [101:132], selectively couple to the i-th level of conductors of $I_i$=32 number of conductors including D[i]=4 sets of (intermediate) conductors, {[151:158], [159:166], [167:174], [175:182]} using the distribution sequence {Original, Prime 3, Prime 5, Prime 7}; not every conductor of $I_{i-1}$ or $I_i$ number of conductors are labeled in the embodiment of FIG. 1B, and for purpose of illustration, those conductors are assumed to be consecutively labeled. A $D_S[i]$-tuple of the embodiment of FIG. 1B is of size four which is the same as the divider D[i] in this embodiment. The $I_{i-1}$ conductors [101:132] are selectively coupled to the first set of $I_i$ conductors [151:158] through $I_{i-1}$ number of switches in 135; the $I_{i-1}$ conductors [101:132] are selectively coupled to the second set of $I_i$ conductors [159:166] through $I_{i-1}$ number of switches in 140, the $I_{i-1}$ conductors [101:132] are selectively coupled to the third set of $I_i$ conductors [167:174] through $I_{i-1}$ number of switches in 145 and the $I_{i-1}$ conductors [101:132] are selectively coupled to the D[i]-th set of $I_i$ conductors [175:182] through $I_{i-1}$ number of switches in 150.

FIG. 1C illustrates one embodiment of the switch couplings between two consecutive levels of conductors in the conventional L-PSN of U.S. patent application Ser. No. 12/327,702 where L>0: the (i−1)-th level of conductors of $I_{i-1}$=32 number of conductors, [101:132], selectively couple to the first level of conductors of $I_i$=32 number of conductors including D[i]=4 sets of (intermediate) conductors, {[151:158], [159:166], [167:174], [175:182]} using the distribution sequence {Prime 3, Prime 5, Prime 7, Prime 13}; not every conductor of $I_{i-1}$ or $I_i$ number of conductors are labeled in the embodiment of FIG. 1C, and for purpose of illustration, those conductors are assumed to be consecutively labeled. A W-$D_S[i]$-tuple of the embodiment of FIG. 1C is of size four which is the same as the divider D[i] in this embodiment; for example, (101, 104, 107, 110) of FIG. 1C would be a W-$D_S[i]$-tuple coupling the first set of the $I_i$ number of conductors. The $I_{i-1}$ conductors [101:132] are selectively coupled to the first set of $I_i$ conductors [151:158] through $I_{i-1}$ number of switches in 135; the $I_{i-1}$ conductors [101:132] are selectively coupled to the second set of $I_i$ conductors [159:166] through $I_{i-1}$ number of switches in 140, the $I_{i-1}$ conductors [101:132] are selectively coupled to the third set of $I_i$ conductors [167:174] through $I_{i-1}$ number of switches in 145 and the $I_{i-1}$ conductors [101:132] are selectively coupled to the D[i]-th set of $I_i$ conductors [175:182] through $I_{i-1}$ number of switches in 150.

In the conventional L-SN and L-PSN designs illustrated in FIG. 1A and FIG. 1B where nets 101 and 102 each carries the same signal connection specification (0), connecting to a pin in the 0-th K-port; nets 103 and 104 each carries the same signal connection specification (1), connecting to a pin in the 1st K-port (the part of switching network connecting to the K-ports are not illustrated in FIG. 1A or FIG. 1B); net 105 carries the signal connection specifications (0,1), connecting to a respective pin in the 0-th K-port and the 1st K-port; with nets 106, 107 and 108 each carries the same signal connection specification (2), connecting to a pin in the 2nd K-port; it can be readily determined, for one skilled in the art, the nine pins in the eight nets cannot be fully connected using the respective switching network subject to the constraint that each of the set of $I_i$ conductors of the D[i] number of sets carries at most one signal to each of the three K-ports [0:2].

Similarly, in the conventional L-PSN design illustrated in FIG. 1C where net 101 carries the signal connection specifications (0,1,2,3), connecting to a respective pin in the 0-th K-port, the 1st K-port, the 2nd K-port and the third K-port; net 104 carries the signal connection specifications (1,2,3,4); net 107 carries the signal connection specifications (2,3,4,5); net 110 carries the signal connection specifications (3,4,5,6); net 113 carries the signal connection specifications (0,1,5,7); net 116 carries the signal connection specifications (0,4,6,7); net 119 carries the signal connection specifications (1,5,6,7) and net 122 carries the signal connection specifications (0,2,6,7); it can be readily determined, for one skilled in the art, that there is no connection solution using the switching network where the first set of $I_i$ number of conductors [151:158] of the D[i] sets of $I_i$ conductors carries one signal to each of the eight K-ports [0:7] while each of the remaining three sets of the $I_i$ number of conductors can be connected to the eight nets, (101, 104, 107, 110, 113, 116, 119, 122), such that each set of $I_i$ number of conductors carries exactly eight signals, [0:7], to the K-ports using the switches of the switching network.

BRIEF DESCRIPTION OF THE DRAWINGS

The objectives, features, and advantages of the present invention will be apparent from the following detailed description in which:

FIG. 4D illustrates one conventional design embodiment of the next stage of the L-PSN of FIG. 4B or FIG. 4C of the of switch couplings between the (i+1)-th and the (i+2)-th levels of conductors with $I_{i+1}=24$, $I_{i+2}=32$, $D[i+2]=4$ and $D_S[i+2]=3$.

DETAILED DESCRIPTION

Figure 1A:
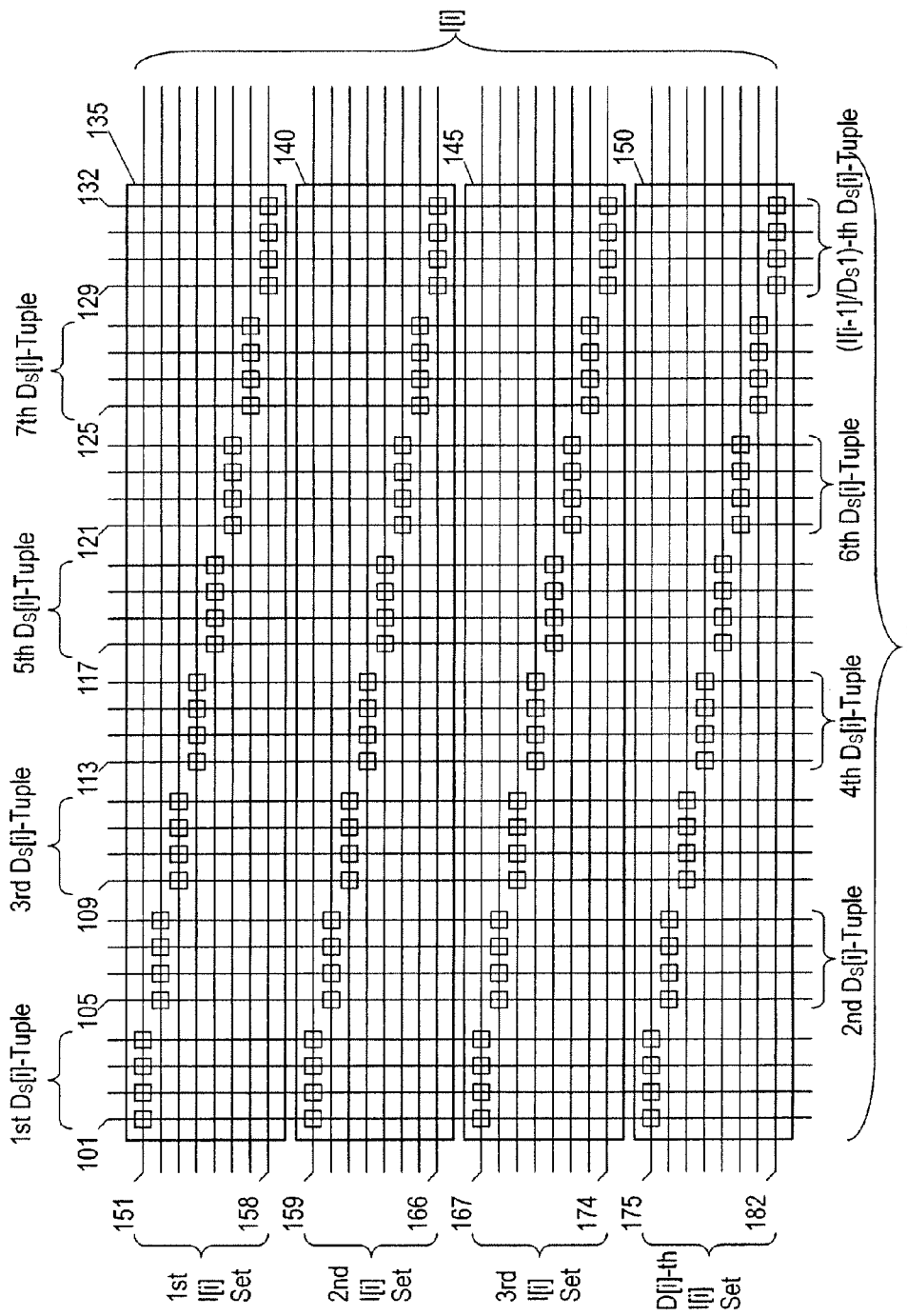
FIG. 1A illustrates a conventional design of switch couplings between two levels of conductors of a L-stages switching network (L-SN) with L>0, $I_{i-1}=I_i$ and $D[i]=D_S[i]$ for an i selected from [1:L+1].

A new L-level(s) permutable switching network (L-PSN) with L-level(s) of intermediate conductors of $I_i$ number of conductors having D[i] sets of conductors for i=[1:L] to connect the 0-th level of pins or conductors of $I_0$ number of pins or conductors to the (L+1)-th level of pins or conductors of $(D[L+1] \times \Pi_{j=[1:L]} D[j])$ number of pins or conductors having D[L+1] sets of pins or conductors through the L level(s) of intermediate conductors where at least $(I_{j-1} \times D[j]+I_j \times Q)$ number of switches are used to selectively couple between (j−1)-th level of pins or conductors if $I_{j-1}$ number of conductors and the j-th level of pins or conductors with $I_j$ number of conductors for an j selected from [1:L+1] and Q at least equal to one and Q is less than $(I_{j-1}-D_S[j])$. An L-PSN of this application uses the same $D_S[i]$-tuple and W-$D_S[i]$-tuple definitions discussed above. Some of the differences of the L-PSN in this application, compared with the conventional L-SN or L-PSN are in the increased number of switches and the schemes in which those switches are used to couple two levels of conductors.

Some embodiments of the L-PSN of this application can be applied to a wide range of applications, as a L-PSN, either fully or used in conjunction with a conventional L-SN, L-PSN or other switching network schemes, to provide a large switch network that can be used in switching networks, routers, and programmable logic circuits. Some embodiments of the permutable switching network of this present invention provides enhanced connectivity or routability over the conventional design, including the handling multicasting signals.

In the following descriptions, for purposes of explanation, numerous specific details are set forth in order to provide a thorough understanding of the present invention. It will be apparent to one skilled in the art that embodiments of the present invention may be practiced without these specific details. In other instances, well-known structures and circuits are shown in block diagram form in order to avoid unnecessarily obscuring the present invention. For purpose of description, unless otherwise specified, the terms program controlled switch and switch are interchangeable in the context of this description; the terms program configured logic cell, logic cell, cell, Look Up Table (LUT), programmable logic cell are interchangeable in the context of this description; the terms conductor, pin, line are interchangeable in the context of this description; signal, net, signal net are interchangeable in the context of this description which generally refers to a conductor carrying signal from a source to destination(s); while port and conductors or a set of conductors are interchangeable in the context of this description where a port has a set of pins or conductors. Thus a net associated with a conductor of a 0-th level of $I_0$ number of conductors or pins generally carries a signal which is to be selectively connected, through a permutable switching network (L-PSN), to one or more conductors or pins, each of which is selected from one of the (L+1)-th level of conductors $(D[L+1] \times \Pi_{i=[1:L]} D[i])$ number of conductors including D[L+1] sets of conductors through L-level(s) of intermediate conductors of $I_i$ number of conductors having D[i] sets of conductors for i=[1:L]. Thus it should be clear, for one skilled in the art, that the terms conductor, pin, line, signal, net are interchangeable depending on the context of this description. The terms, $I_i$ conductors or $I_i$ number of conductors, are generally referred to the conductors of the i-th level of conductors for i=[0:L+1] in the L-PSN and can be used either indicating of the number or set of conductors of the i-th level of conductors. The notations [ ] and ( ) sometimes are used interchangeably to indicate one or more objects (elements) such as conductors or pins being grouped together while D[i] or $D_S[i]$ are parameters associated with the switch couplings between the (i−1)-th level of conductors and the i-th level of conductors. It should also be noted that the present invention describes embodiments which use program control means to set the states of switches utilized, this control means can be one time, such as fuse/anti-fuse technologies, or re-programmable, such as SRAM (which is volatile), FLASH (which is non-volatile), Ferro-electric (which is non-volatile), etc. Hence the present invention pertains to a variety of processes, including, but not limited to, static random access memory (SRAM), dynamic random access memory (DRAM), fuse/anti-fuse, erasable programmable read-only memory (EPROM), electrically erasable programmable read-only memory (EEPROM) such as FLASH, and Ferro-electric processes.

In some embodiments, the design and/or layout of the integrated circuits described above can be performed by a computing machine (e.g., a server, a personal computer, etc.) in response to instructions embodied in a machine-readable storage medium of an article of manufacture. Some examples of a machine-readable storage medium include any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus. Furthermore, data representing the design and/or layout of the integrated circuits described above can be embodied in a machine-readable storage medium of an article of manufacture.

When a program controlled switch is used to interconnect one conductor to another conductor, a driver circuit may be coupled to the switch to improve the speed of the signal traversing those conductors; thus a switch can be comprised of a driver circuit. Additionally, if multiple conductors (signals) fan-in to a conductor through program controlled switches, it is possible to use a MUX scheme, if desired, to either reduce loading on the conductor or to reduce circuit size, or both, depending on the process technology used. In the case where a MUX is used, the multiple switches are converted into a new switching mechanism where, the number of control states are the same as the number of switches; connectivity is enabled by choosing the particular state (corresponding to the switch when multiple switches were used) in connecting two conductors and the states are determined by program control; as an example, in a four to one MUX there are four states to control the selection of which one of the four inputs is connected to the one output hence each state corresponds to a respective switch which can be program controlled.

In this application, various alternative schemes of switch couplings operating on $D_S[i]$-tuples or $W$-$D_S[i]$-tuples between the (i−1)-th level of conductors and the i-th level of conductors are described to enhance connectivity or routing in the presence of multicasting signals. In many L-PSN illustrations in this application, a $D_S[i]$-tuple (but not necessarily $W$-$D_S[i]$-tuples) will be mostly drawn as having consecutively labeled numbers.

The new L-PSN has the following formulations:
For at least one i selected from [1:L+1] and Q is selected from $[1:(I_{i-1}-D_S[i]-1)]$, PSN-(A): Each conductor of the $I_{i-1}$ number of conductors of the (i−1)-th level of conductors selectively couples to at least (D[i]+Q) number of conductors of the i-th level of conductors selected from at least one conductor in each set of the D[i] sets of conductors of the i-th level of conductors of $I_i$ number of conductors through a corresponding number of switches.

PSN-(B): The $I_{i-1}$ number of conductors of the (i−1)-th level of conductors selectively couple to the conductors of each set of the D[i] sets of conductors of the i-th level of conductors through at least $(I_{i-1}+(I_i/D[i])\times Q)$ number of switches with a total of at least $(I_{i-1}\times D[i]+I_i\times Q)$ number of switches coupling between the two levels of conductors.

For ease of discussions, the switches corresponding to the conventional designs in U.S. Pat. Nos. 6,975,139, 7,256,614 and 7,417,457 and the two related applications, U.S. patent application Ser. Nos. 12/327,702 and 12/327,704, will be denoted by squares in the figures and those $I_i$ number of additional switches will be denoted by circles in the figures; additionally, when a switch is selected for use to connect two conductors, the corresponding square or circle denoting the switch is blackened in the illustrations.

It can be readily determined, for one skilled in the art, that each of the switching networks illustrated in the embodiments of FIG. 2A through FIG. 3B meets the L-PSN formulations PSN-(A) and PSN-(B) above; thus for Q=1, there are a total of $((I_i/D[i])\times Q)$ number of additional number of switches selectively coupling between the $I_{i-1}$ number of conductors of the (i−1)-th level of conductors and one of the D[i] sets of conductors with $(I_i/D[i])$ number of conductors of the i-th level of conductors, as compared with the conventional designs of U.S. Pat. No. 6,975,139, 7,256,614 and 7,417,457 and the two applications: U.S. patent application Ser. Nos. 12/327,702 and 12/327,704 thus there are $(I_i\times Q)$ number of additional number of switches selectively coupling between the $I_{i-1}$ number of conductors of the (i−1)-th level of conductors and the $I_i$ number of conductors of the i-th level of conductors.

Figure 2A:
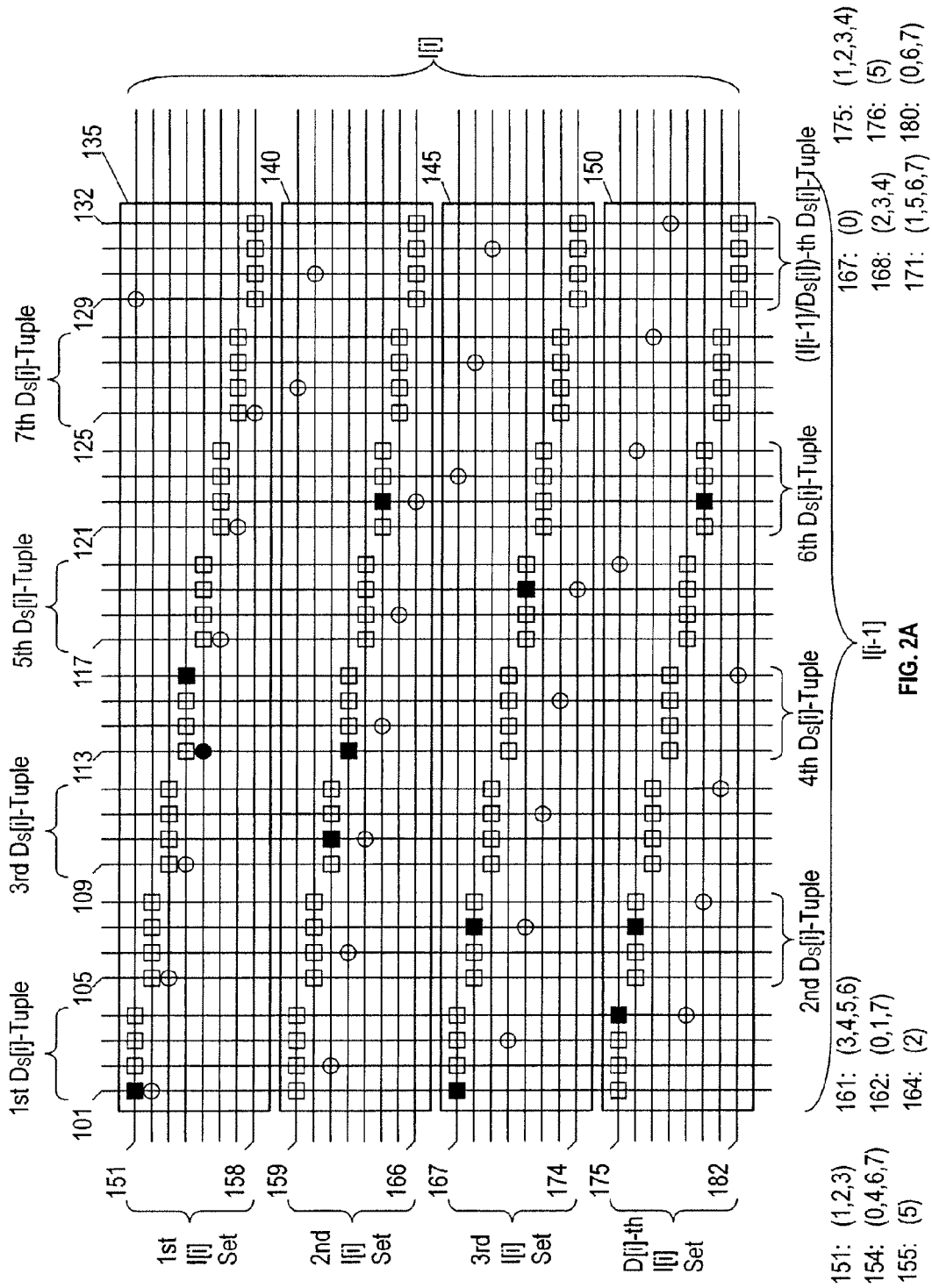
FIG. 2A illustrates one embodiment of the L-PSN of switch couplings between two levels of conductors with L>0, Q=1, $I_{i-1}=I_i$ and $D[i]=D_S[i]$ for an i selected from [1:L+1].

The switches represented by squares in the embodiment of FIG. 2A illustrated a new L-PSN with $D_S[i]=D[i]=4$, $I_{i-1}=I_i=32$ and Q=1 where, excluding the switches represented by circles, the $D_S[i]$-tuples of the (i−1)-th level of the $I_{i-1}$ number of conductors coupling the i-th-level of D[i] sets of conductors of the $I_i$ number of conductors are the same as a conventional L-SN described in U.S. Pat. Nos. 6,975,139, 7,256,614 and 7,417,457 and the two related applications, U.S. patent application Ser. Nos. 12/327,702 and 12/327,704; for example, the $D_S[i]$ number of conductors, [101:104], is a $D_S[i]$-tuple, as those others denoted in the embodiment of FIG. 2A. The at least $I_i$ number of switches represented by circles in the embodiment of FIG. 2A illustrated the additional switches used in this application to enhance the routing capability of the enhanced L-PSN.

Figure 2B:
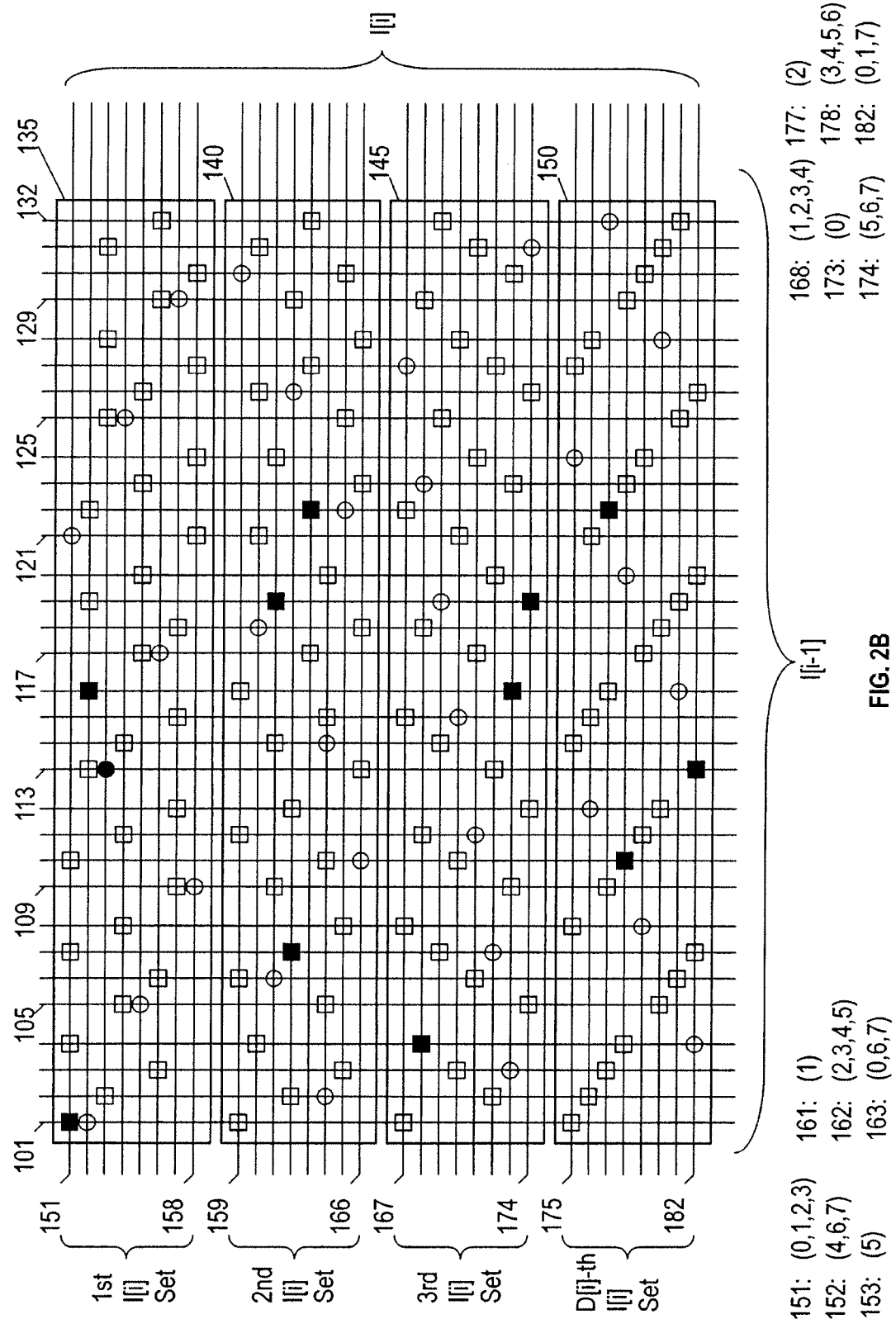
FIG. 2B illustrates another embodiment of the L-PSN of switch couplings between two levels of conductors with L>0, Q=1, $I_{i-1}=I_i$ and $D[i]=D_S[i]$ for an i selected from [1:L+1].

Similarly, the square switches in the new L-PSN with $D_S[i]=D[i]=4$, $I_{i-1}=I_i=32$ and Q=1 illustrated in FIG. 2B correspond to the switches of a conventional L-PSN with the "Prime 3, Prime 5, Prime 7, Prime 13" distribution described in U.S. patent application Ser. No. 12/327,702 with at least an additional $I_i$ number of switches represented by the circles; any $D_S[i]$ number of conductors of the $I_{i-1}$ number of conductors connecting one conductor of one of the D[i] sets of conductors of the $I_i$ number of conductors through $D_S[i]$ number of switches is a $W$-$D_S[i]$-tuple with respect to the particular set of the D[i] sets, thus [101, 104, 107, 110] is a $W$-$D_S$[i]-tuple with respect to the first set of the $I_i$ number of conductors and [104, 107, 113, 120] is an example of another $W$-$D_S[i]$-tuple with respect to the last or the D[i]-th set. The square switches in the new L-PSN with $D_S[i]=3$, D[i]=4, $I_{i-1}=24$ and $I_i=32$ illustrated in FIG. 3A correspond to the switches of a conventional L-SN described in U.S. Pat. Nos. 6,975,139, 7,256,614, 7,417,457 and U.S. patent application Ser. No. 12/327,704 with at least an additional $I_i$ number of switches represented by the circles. In one embodiment of a new L-PSN illustrated in FIG. 3B, the square switches with $D_S[i]=3$, D[i]=4, $I_{i-1}=24$ and $I_i=32$ correspond to the switches of a conventional L-PSN described in U.S. patent application Ser. No. 12/327,702 with the "barrel shift to the right by one" distribution with at least an additional $I_i$ number of switches represented by the circles.

Figure 1B:
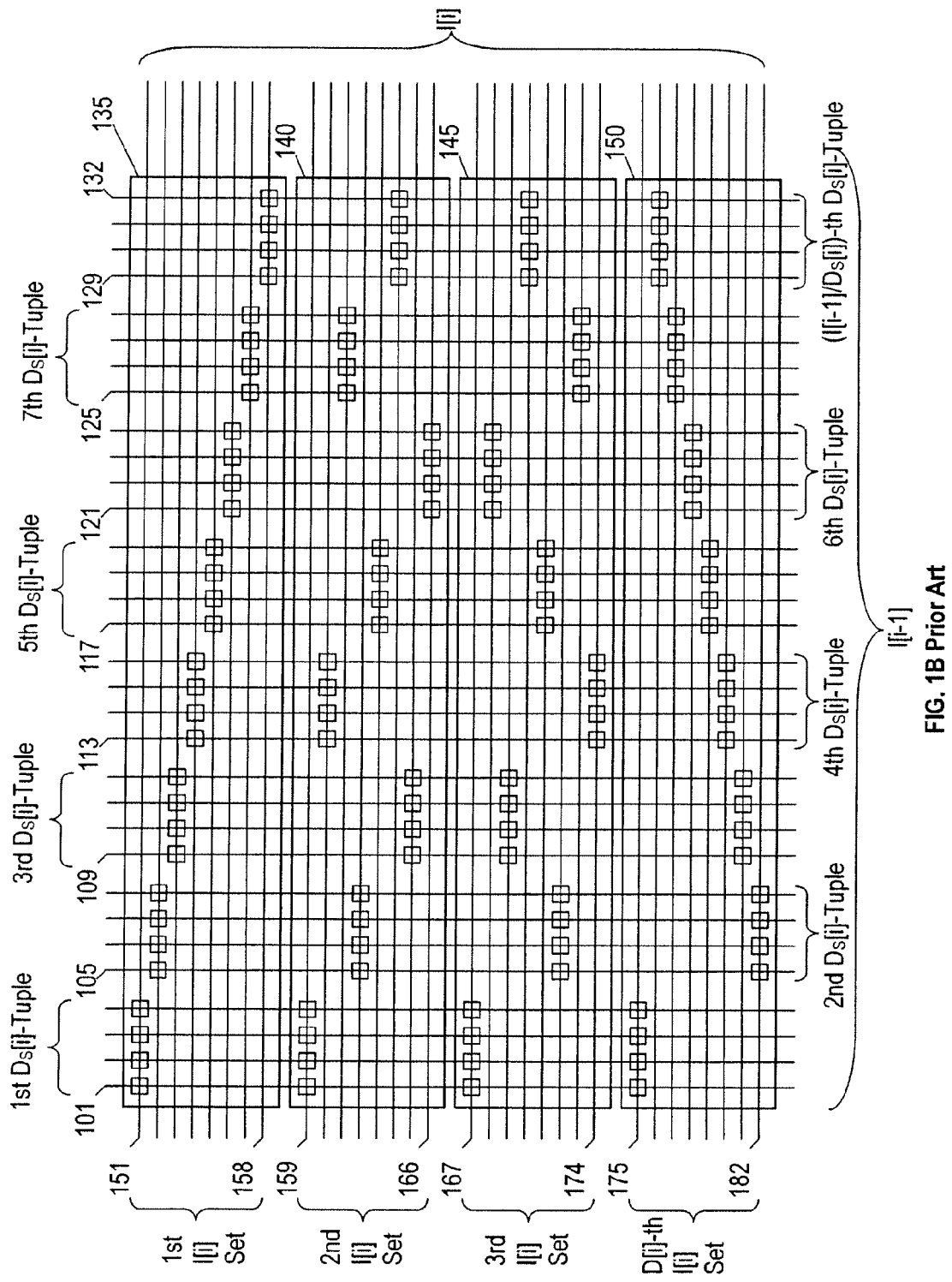
FIG. 1B illustrates another conventional design of switch couplings between two levels of conductors of a L-stages switching network (L-PSN) with L>0, $I_{i-1}=I_i$ and $D[i]=D_S[i]$ for an i selected from [1:L+1].

It is readily determined, for one skilled in the art, that the eight nets where nets 101 and 102 each carries the same signal connection specification (0), connecting to a pin in the 0-th K-port; nets 103 and 104 each carries the same signal connection specification (1), connecting to a pin in the 1st K-port; net 105 carries the signal connection specifications (0,1), connecting to a respective pin in the 0-th K-port and the 1st K-port; with nets 106, 107 and 108 each carries the same signal connection specification (2), connecting to a pin in the 2nd K-port illustrated using FIG. 1A and FIG. 1B can be interconnected to the desired signal connection specifications in the prior discussions using either of the L-PSN switching networks illustrated in the embodiments of FIG. 2A and FIG. 2B.

Figure 1C:
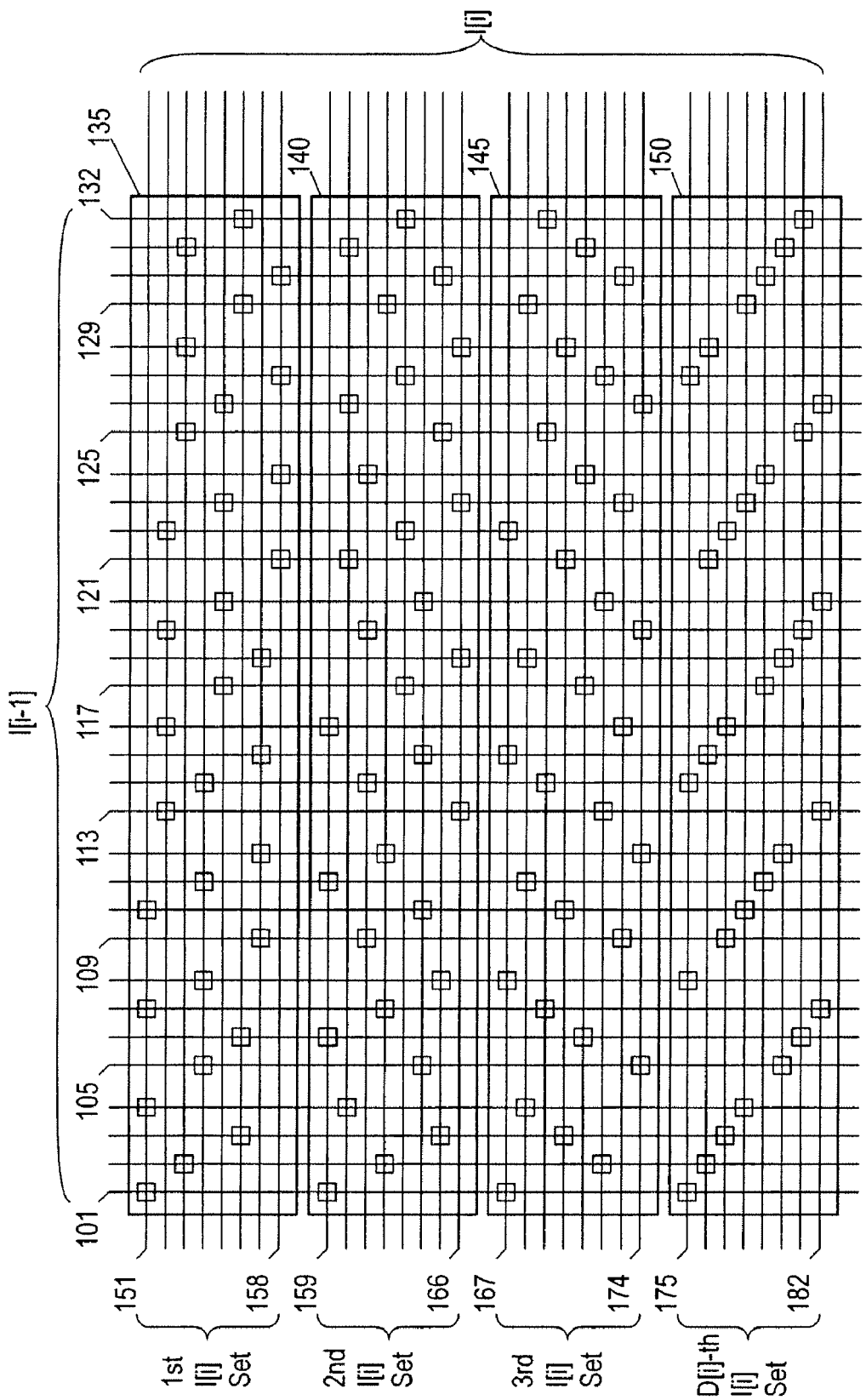
FIG. 1C illustrates another different conventional design of switch couplings between two levels of conductors of another L-stages switching network (L-PSN) with L>0, $I_{i-1}=I_i$ and $D[i]=D_S[i]=4$ for i selected from [1:L+1].

The eight nets example where net 101 carries the signal connection specifications (0,1,2,3), connecting to a respective pin in the 0-th K-port, the 1st K-port, the 2nd K-port and the third K-port; net 104 carries the signal connection specifications (1,2,3,4); net 107 carries the signal connection specifications (2,3,4,5); net 110 carries the signal connection specifications (3,4,5,6); net 113 carries the signal connection specifications (0,1,5,7); net 116 carries the signal connection specifications (0,4,6,7); net 119 carries the signal connection specifications (1,5,6,7) and net 122 carries the signal connection specifications (0,2,6,7) illustrated using FIG. 1C which can not be fully connected with routing or interconnection failure occurring in the first set of the D[i] sets of $I_i$ conductors.

The same eight nets can be fully connected or routed using the L-PSN switching network illustrated in the embodiment of FIG. 2A: signal connection specifications (0,1,2,3) of net 101 is routed by connecting to the $I_i$ conductors 151 and 167 with 151 carrying signal connection specifications (1,2,3) and 167 carrying (0); net 104 with (1,2,3,4) is routed by connecting to $I_i$ conductor 175 with (1,2,3,4); net 107 with (2,3,4,5) is routed by connecting to $I_i$ conductors 168 with (2,3,4) and 176 with (5); net 110 with (3,4,5,6) is routed by connecting to $I_i$ conductor 161 with (3,4,5,6); net 113 with (0,1,5,7) is routed by connecting to $I_i$ conductors 155 with (5) and 162 with (0,1,7); net 116 with (0,4,6,7) is routed by connecting to $I_i$ conductor 154 with (0,4,6,7); net 119 with (1,5,6,7) is routed by connecting to $I_i$ conductor 171 with (1,5,6,7) and net 122 with (0,2,6,7) is routed by connecting to $I_i$ conductors 164 with (2) and 180 with (0,6,7). Thus in FIG. 2A: the first of the D[i] sets of $I_i$ conductors with conductors (151, 154, 155) together has the signal connection specifications (0:7), the second of the D[i] sets of $I_i$ conductors with conductors (161, 162, 164) together has the signal connection specifications (0:7), the third of the D[i] sets of $I_i$ conductors with conductors (167, 168, 171) together has the signal connection specifications (0:7) and the last or the D[i]-th set of $I_i$ conductors with conductors (175, 176, 180) together has the signal connection specifications (0:7).

Similarly, the signal connection specifications of the same eight nets example with 32 K-port pins can be routed using the new L-PSN illustrated in FIG. 2B: Net 101 with signal connection specifications (0,1,2,3) connects to 151 with (0,1,2,3), Net 104 with (1,2,3,4) connects to 168 with (1,2,3,4), Net 107 with (2,3,4,5) connects to 162 with (2,3,4,5), Net 110 with (3,4,5,6) connects to 178 with (3,4,5,6), Net 113 with (0,1,5,7) connects to 153 with (0,1) and 182 with (0,1,7), Net 116 with (0,4,6,7) connects to 152 with (4,6,7) and 173 with (0), Net 119 with (1,5,6,7) connects to 161 with (1) and 174 with (5,6,7), Net 122 with (0,2,6,7) connects to 163 with (0,6,7) and 177 with (2); thus it can be readily determined that the conductors in each of D[i] sets of conductors carry the complete signal connection specifications (0:7).

Figure 3A:
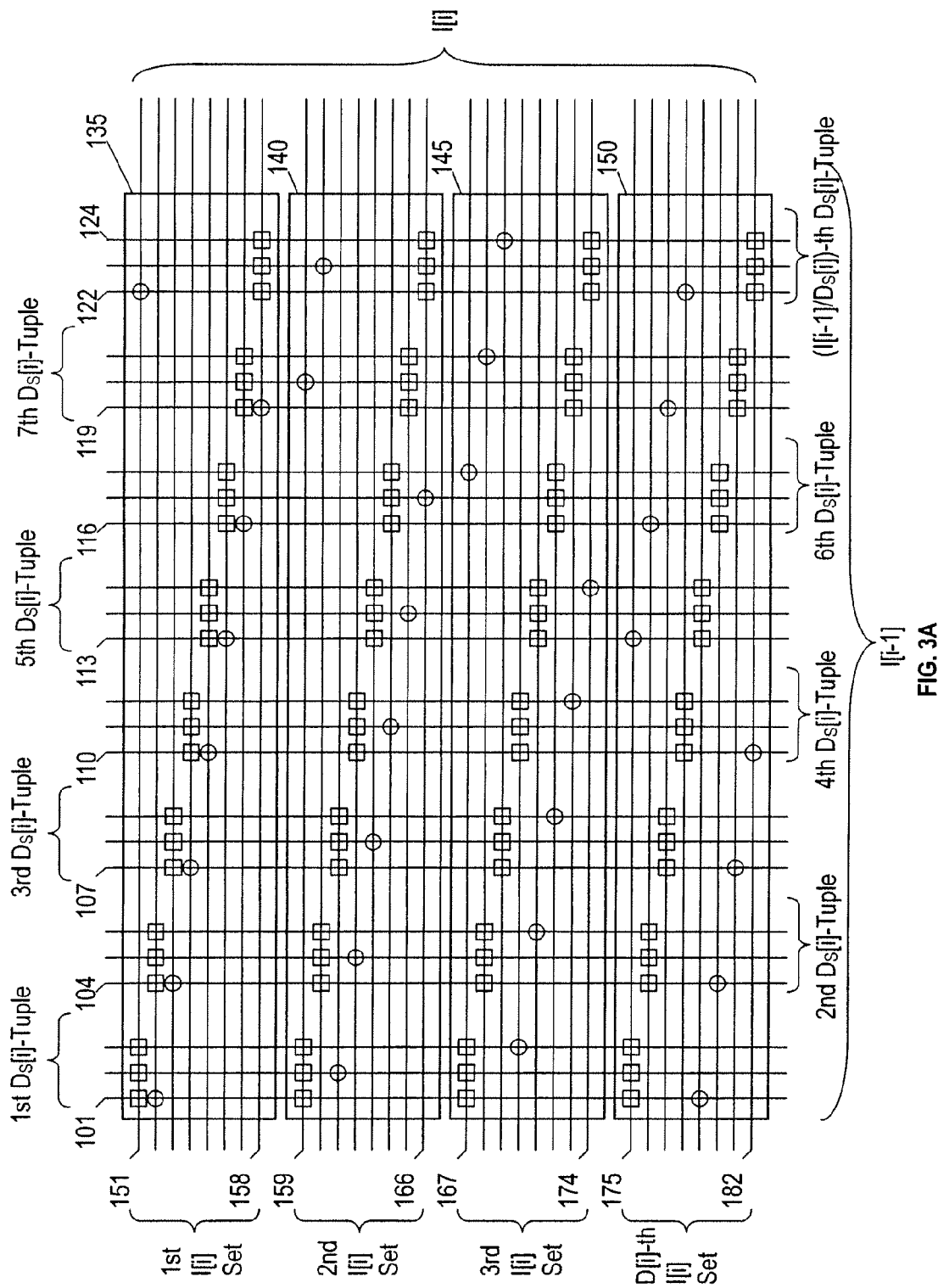
FIG. 3A illustrates one embodiment of the L-PSN of switch couplings between two levels of conductors with L>0, Q=1, $I_{i-1}=24$, $I_{i-1}=32$, $D[i]=4$ and $D_S[i]=3$ for an i selected from [1:L+1].

In the new L-PSN illustration of FIG. 3A, $I_{i-1}$ is less than $I_i$ where $D_S[i]=(D[i] \times (I_{i-1}/I_i))$ by considering the $I_{i-1}$ number of conductors coupling to the $I_i$ number of conductors through the switches represented as squares in one of the conventional design described in U.S. Pat. Nos. 6,975,139, 7,256,614 and 7,417,457; the switches represented as circles in the embodiment of FIG. 3A are the additional $I_i$ number of switches meeting the PSN-(A) and PSN-(B) formulations.

Figure 3B:
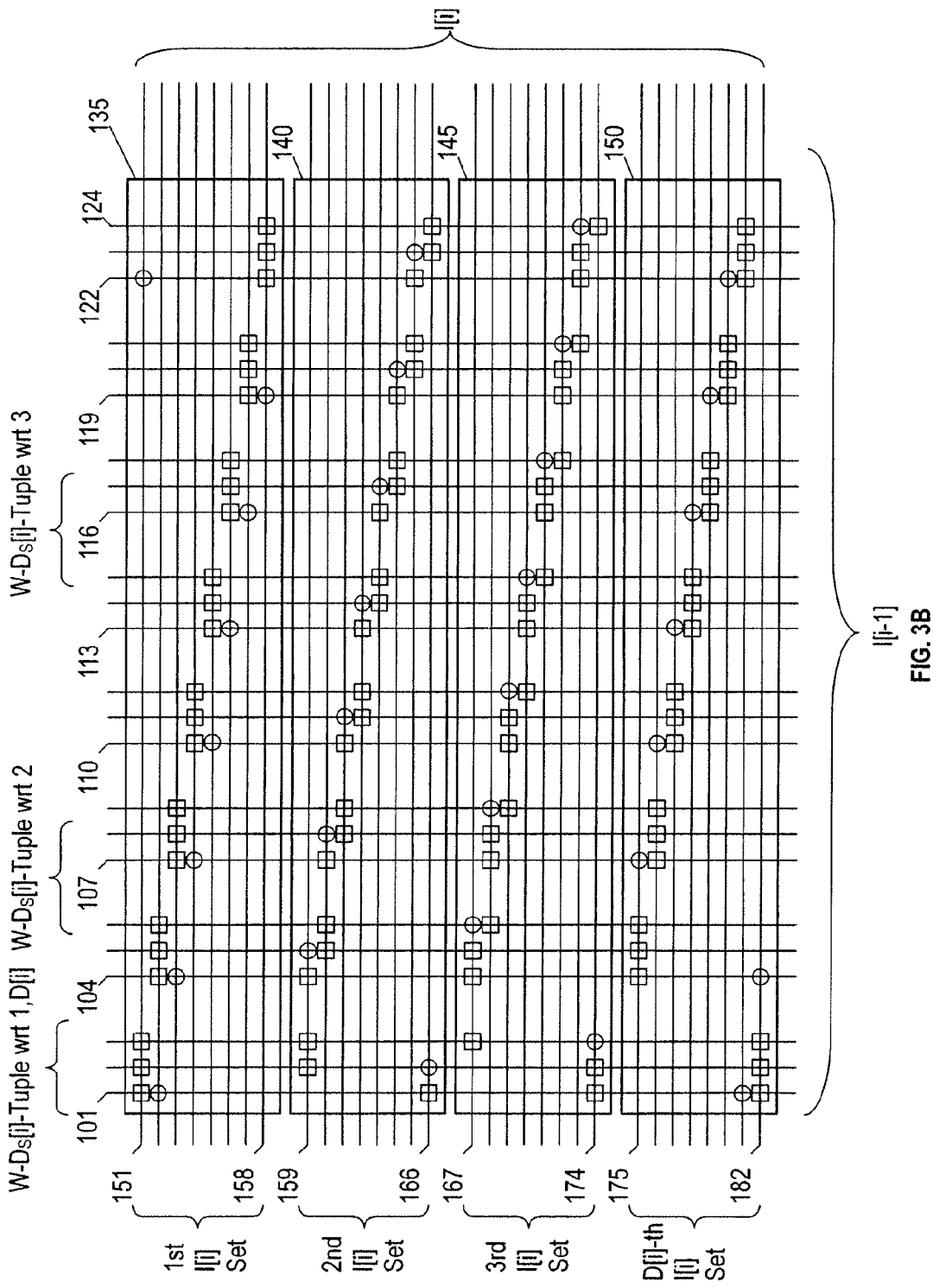
FIG. 3B illustrates another embodiment of the L-PSN of switch couplings between two levels of conductors with L>0, Q=1, $I_{i-1}=24$, $I_i=32$, $D[i]=4$ and $D_S[i]=3$ for an i selected from [1:L+1].

In the new L-PSN illustration of FIG. 3B, $I_{i-1}$ is less than $I_i$ where $D_S[i]=(D[i] \times (I_{i-1}/I_i))$ by considering the $I_{i-1}$ number of conductors coupling to the $I_i$ number of conductors through the switches represented as squares in one of the conventional design described as "barrel shift to the right by one switch" in U.S. patent application Ser. No. 12/327,702; the switches represented as circles in the embodiment of FIG. 3B are the additional $I_i$ number of switches meeting the PSN-(A) and PSN-(B) formulations. The $I_{i-1}$ conductors, [101:103], is a W-$D_S[i]$-tuple with respect to the first and the D[i]-th sets of the $I_i$ number of conductors, [106:108] is a W-$D_S[i]$-tuple with respect to the second set, [115:117] is a W-$D_S[i]$-tuple with respect to the third set in FIG. 3B.

It can be readily determined, for one skilled in the art, that there are multiple solutions for the eight nets example with 32 pins in the new L-PSN illustrated in FIG. 3A and FIG. 3B.

The various embodiments of the new L-PSN illustrated in FIG. 2A through FIG. 3B for a selected i chosen from [1:L+1] and Q=1 meet the PSN-(A) and PSN-(B) formulations above and each has the additional properties or characteristics that each conductor in each of the D[i] sets of $I_i$ number of conductors of the i-th level of conductors is selectively coupled to ($D_S[i]+Q$) number of conductors of the (i−1)-th level of conductors through a respective ($D_S[i]+Q$) number of switches. Additionally, as illustrated in the embodiments of FIG. 2A and FIG. 2B, with $D_S[i]=D[i]$ or $I_{i-1}=I_i$ and Q=1, each conductor of the (i−1)-th level of conductors of $I_{i-1}$ number of conductors is selectively coupled to (D[i]+Q) number of conductors of the i-th level of $I_i$ number of conductors through a respective (D[i]+Q) number of switches.

The various embodiments illustrated in FIG. 2A through FIG. 3B refer to switch couplings between an (i−1)-the level of conductors and an i-th level of conductors; the $I_{i-1}$ number of conductors and the $I_i$ number of conductors discussed can either be the global or entire number of conductors of the respective level of conductors or a subset or localized number of conductors of the respective number of conductors.

Figure 4A:
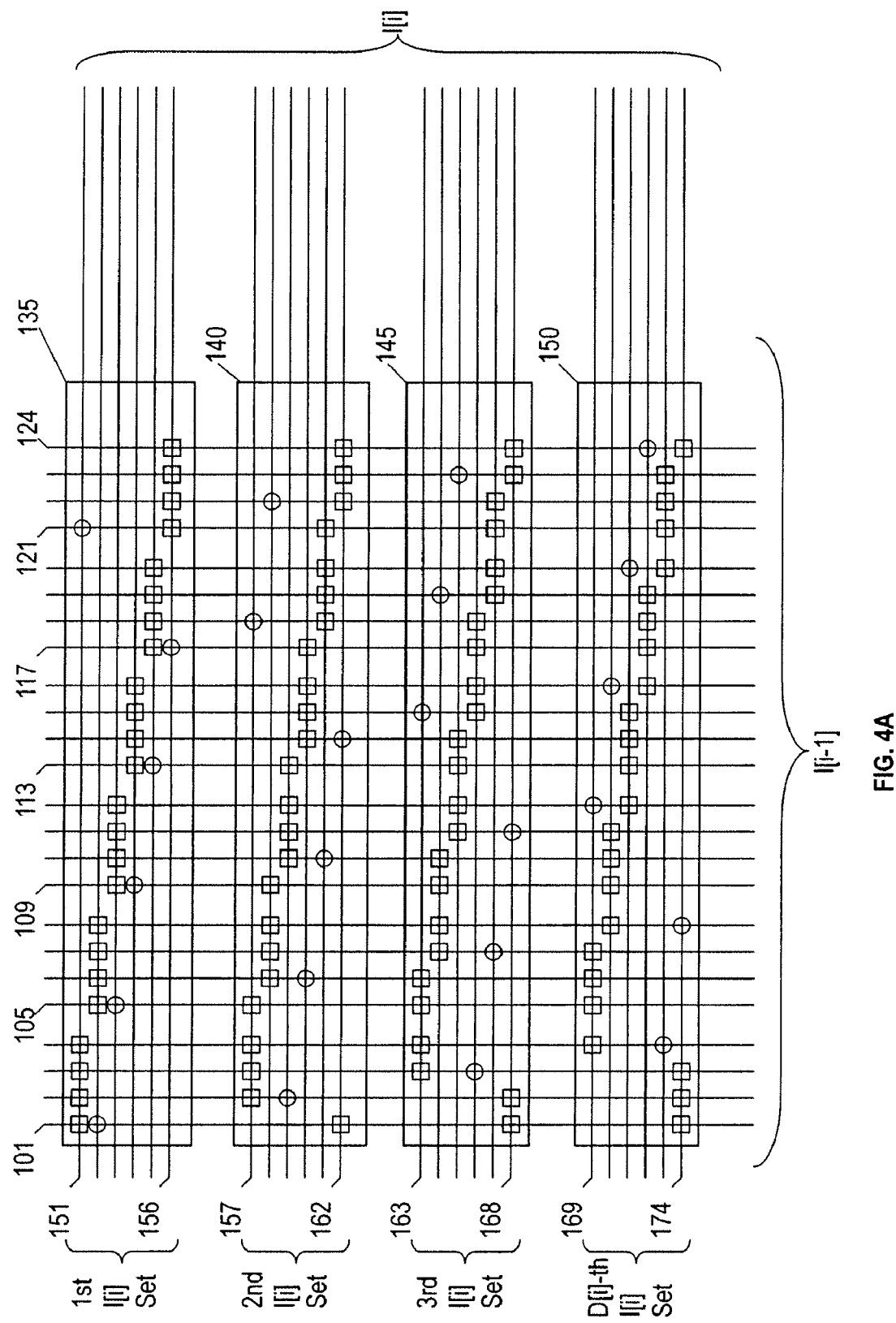
FIG. 4A illustrates one embodiment of the L-PSN of switch couplings between a first two levels of conductors with L>0, $I_{i-1}=I_i$ and $D[i]=D_S[i]$ for an i selected from [1:L+1] and Q=1.
Figure 4B:
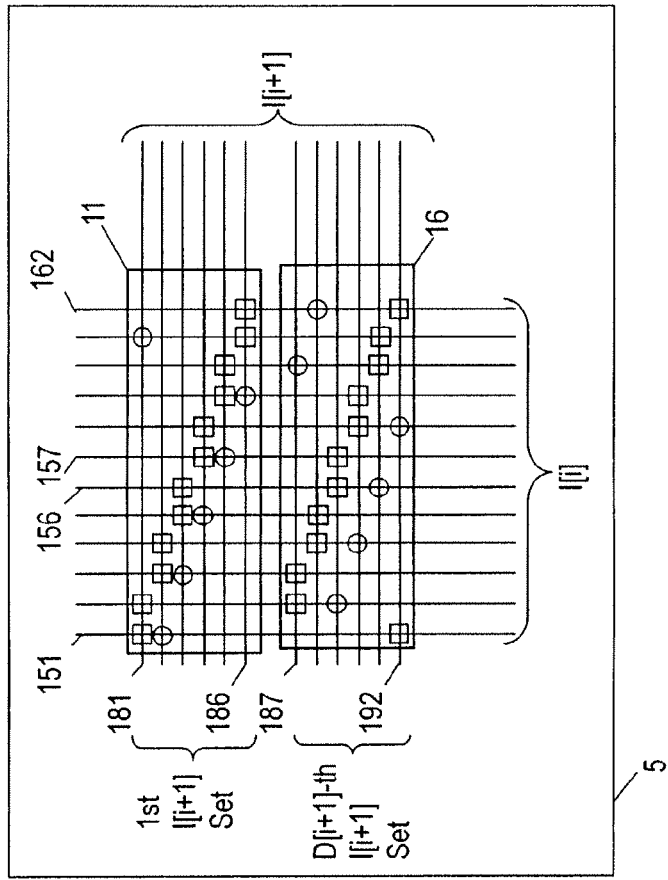
FIG. 4B illustrates portions of two alternate embodiments of the of switch couplings between the i-th and the (i+1)-th levels of conductors of the L-PSN of FIG. 4A with $I_i=I_{i+1}$ and $D[i+1]=D_S[i+1]$ for Q=1.
Figure 4B:
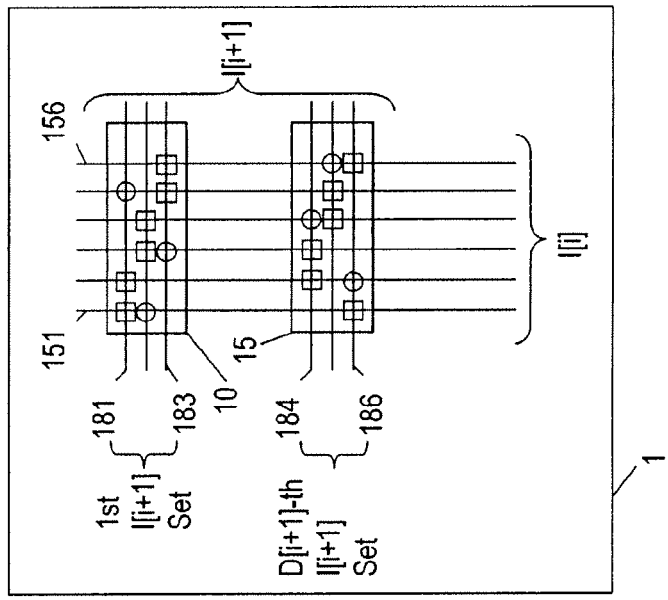

For i=1 and Q=1, a new L-PSN with four levels of conductors, $I_0$, $I_1$, $I_2$ and $I_3$, where $I_0=I_1=I_2=24$ and $I_3=32$ are illustrated in FIG. 4A through FIG. 4D. The $I_0$ number of conductors and the $I_1$ number of conductors are selectively coupled through (($I_0 \times D[1]$)+$I_1 \times Q$) number of switches in FIG. 4A; two localized couplings where portions of the $I_1$ number of conductors and the $I_2$ number of conductors are selectively coupled through a total of (($I_1 \times D[2]$)+$I_2 \times Q$) number of switches are illustrated in the embodiment of FIG. 4B; global couplings where the $I_1$ number of conductors and the $I_2$ number of conductors are selectively coupled through (($I_1 \times D[2]$)+$I_2 \times Q$) number of switches in FIG. 4C; and the $I_2$ number of conductors and the $I_3$ number of conductors are selectively coupled through ($I_2 \times D[3]$) number of switches in the embodiment of FIG. 4D which comprises one of the L-SN of the conventional designs described in U.S. Pat. Nos. 6,975,139, 7,256,614 and 7,417,457.

In the localized cases, which are respectively illustrated in the embodiment 1 of FIG. 4B, the $I_{i-1}$ number of conductors of the (i−1)-th level of conductors are comprised of $\Pi_{j=[0:i-1]}D[j]$ groups of conductors having $(I_{i-1}/\Pi_{j=[0:i-1]}D[j])$ number of conductors in each group. Correspondingly, the $I_i$ number of conductors of the i-th level of conductors are comprised of $\Pi_{j=[0:i-1]}D[j]$ groups of conductors having $(I_i/\Pi_{j=[0:i-1]}D[j])$ number of conductors in each group or alternatively, the D[i] sets or groups of conductors each having $(I_i/\Pi_{j=[0:i]}D[j])$ number of conductors in each of the $\Pi_{j=[0:i-1]}D[j]$ groups of conductors. Thus in the new L-PSN, for the specific i>0, the $(I_{i-1}/\Pi_{j=[0:i-1]}D[j])$ number of conductors in each of the $\Pi_{j=[0:i-1]}D[j]$ groups of conductors of the (i−1)-th level of conductors selectively couple to the D[i] sets of $(I_i/\Pi_{j=[0:i]}D[j])$ number of conductors through $(((I_{i-1}/\Pi_{j=[0:i-1]}D[j])\times D[i])+((I_i/\Pi_{j=[0:i-1]}D[j])\times Q))$ number of switches. Since there are $\Pi_{j=[0:i-1]}D[j]$ number of the above couplings, the total number of switches coupling between the (i−1)-th and the i-th levels of conductors is thus $\Pi_{j=[0:i-1]}D[j]\times(((I_{i-1}/\Pi_{j=[0:i-1]}D[j])\times D[i])+((I_i/\Pi_{j=[0:i-1]}D[j])\times Q))=((I_{i-1}\times D[i])+(I_i\times Q))$ number of switches. Specifically, in the embodiment illustrated by the box labeled as 1 in FIG. 4B, for i=1, a subset of conductors [151:156], of the $I_1$ number of conductors of the 1st level of conductors (which correspond to the same numbered conductors in FIG. 4A), selectively couple to another subset of conductors [181:186] which are divided into D[2]=2 sets, [181:183] and [184:186] (which correspond to the same labeled conductors in FIG. 4D); thus for i=1, the $I_1$ number of conductors comprises $\Pi_{j=[0:i]}D[j]=4$ sets of conductors having $(I_i/\Pi_{j=[0:i]}D[j])=6$ conductors in each of the sets. The subset of conductors of the $I_1$ number of conductors [157:162] are similarly coupled to [187:192] of the $I_2$ number of conductors, [163:168] of the $I_1$ number of conductors are similarly coupled to [193:198] of the $I_2$ number of conductors and [169:174] of the $I_1$ number of conductors are similarly coupled to [199:204] of the $I_2$ number of conductors as described in the embodiment of 1 in FIG. 4B. There are a total of $(D[0]\times D[1])=4$ number of localized couplings with one such couplings illustrated in 1 of FIG. 4B, or $\Pi_{j=[0:i]}D[j]$ sets or groups of $(I_{i+1}/\Pi_{j=[0:i]}D[j])$ number of conductors (which is equal to 24/4=6 for i=1) of the $I_{i+1}$ number of conductors which comprises of D[i+1] sets of conductors of the $I_{i+1}$ number of conductors including $(I_{i+1}/\Pi_{j=[0:i+1]}D[j])$ number of conductors (which is equal to 24/8=3 for i=1 where D[i+1]=2) in each of the D[i+1] sets.

It can be readily determined, for one skilled in the art, that a larger granularity of conductors of the $I_i$ number of conductors, e.g. $((I_i/\Pi_{j=[0:i]}D[j])\times T)$ for T>1, can selectively couple to a respective number of $I_{i+1}$ number of conductors, e.g. $((I_{i+1}/\Pi_{j=[0:i]}D[j])\times T)$, which are organized as D[i+1] sets of conductors of size $((I_{i+1}/\Pi_{j=[0:i+1]}D[j])\times T)$ each, through $(T\times((I_i/\Pi_{k=[0:i]}D[k])+((I_{i+1}/\Pi_{k=[0:i+1]}D[k])\times Q)))$ number of switches for each of the D[i+1] sets, thus a total of $(T\times D[i+1]\times((I_i/\Pi_{k=[0:i]}D[k])+((I_{i+1}/\Pi_{k=[0:i+1]}D[k])\times Q)))$ number of switches. For example, the embodiment in 5 of FIG. 4B illustrates a case where T=2 in the manner described in the above discussions.

There are thus several ways of viewing the localized groupings of the $I_i$ number of conductors of the i-th level of conductors for i=[1:L+1]: (1) The $I_i$ number of conductors comprise D[i] sets of conductors having $(I_i/D[i])$ number of conductors in each of the D[i] sets of conductors; (2) the $I_i$ number of conductors comprise $\Pi_{j=[0:i]}D[j]$ groups of conductors having $(I_i/\Pi_{j=[0:i]}D[j])$ number of conductors in each group; and (3) the $I_i$ number of conductors comprise D[i] sets of conductors where each of the D[i] sets of conductors comprise $\Pi_{j=[0:i-1]}D[j]$ groups of $(I_i/\Pi_{j=[0:i]}D[j])$ number of conductors.

Figure 4C:
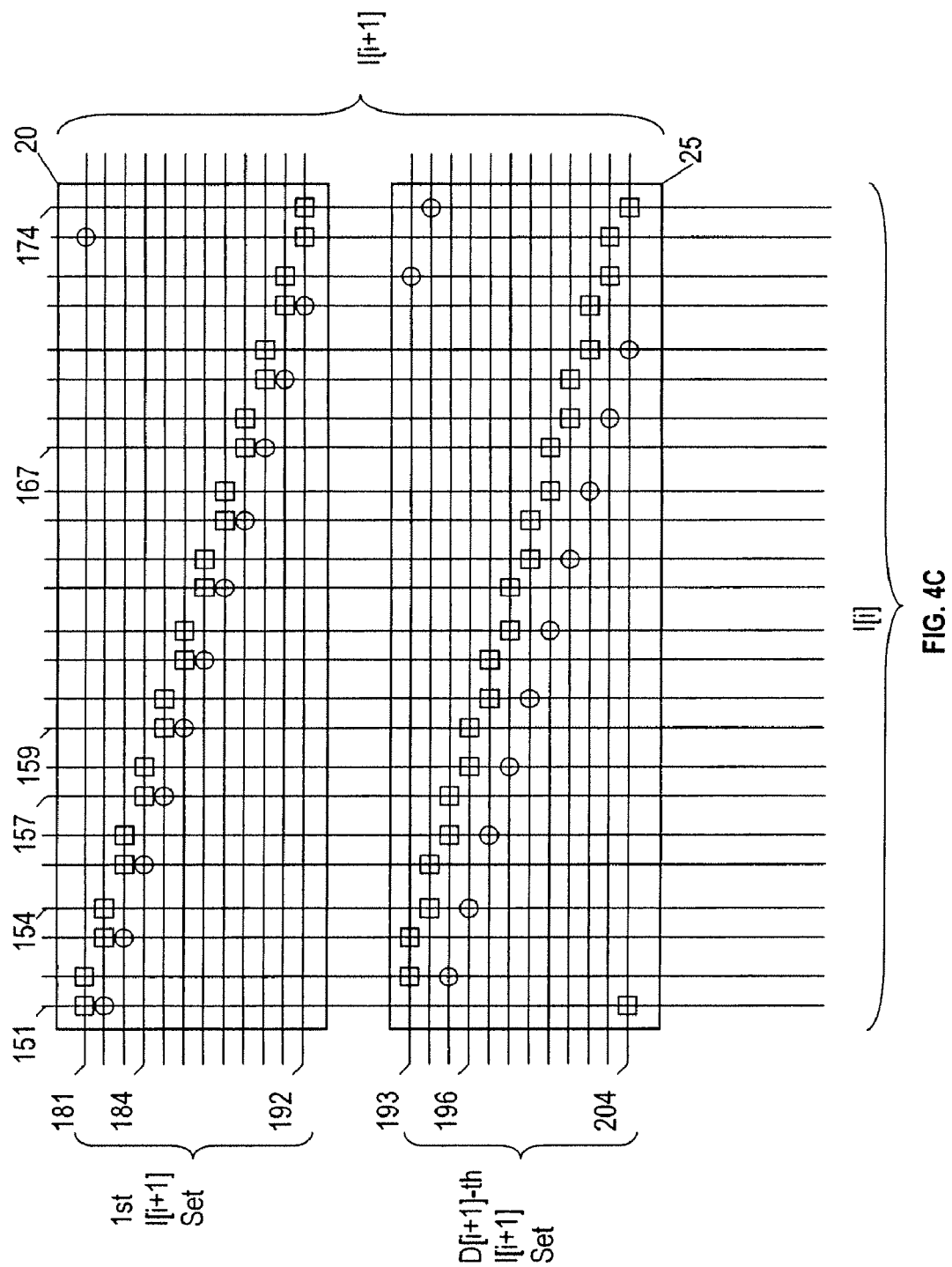
FIG. 4C illustrates the next stage embodiment of the L-PSN of FIG. 4A of the of switch couplings between the i-th and the (i+1)-th levels of conductors with $I_i=I_{i+1}$ and $D[i+1]=D_S[i+1]$ for Q=1.

In the global case, the parameter "T" described above is the product sum of the prior D[j]s, namely, $T=\Pi_{j=[0:i]}D[j]$; thus the $I_i$ number of conductors of the i-th level of conductors selectively couple to D[i+1] set of conductors of the $I_{i+1}$ number of conductors with $(I_{i+1}/D[i+1])$ number of conductors in each set through a total of $((I_i\times D[i+1])+(I_{i+1}\times Q))$ number of switches as illustrated in the embodiment of FIG. 4C.

The generalized L-PSN formulations illustrated so far always refers to $(I_{i-1}+((I_i/D[i])\times Q))$ number of switches which are used to selectively couple the conductors of an (i−1)-th level of conductors of $I_{i-1}$ number of conductors to the conductors of one set of the D[i] sets of conductors of the i-th level of conductors of $I_i$ number of conductors, where a subset of conductors of the (i−1)-level of conductors selectively couple to a subset of conductors of the i-th level of conductors prescribed by the formulations of PSN-(A) and PSN-(B) for at least one i selected from [1:L+1] and Q is selected from $[1:(I_{j-1}-D_S[j]-1)]$ in the L-PSN.

Based on the conventional designs described in U.S. Pat. Nos. 6,975,139, 7,256,614 and 7,417,457, switch couplings between two levels of conductors can have a minimum of $(I_{j-1}-D[j]+1)$ number of switches for j≠i where j=[1:L+1] which selectively couple between the $I_{j-1}$ number of conductors of the (j−1)-th level of conductors and the conductors of each of the D[j] sets of conductors of the $I_j$ number of conductors of the j-th level of conductors while the switch couplings between the (i−1)-th level of conductors and the i-th level of conductors meeting the PSN-(A) and PSN-(B) formulations can be viewed as a minimal new L-PSN. Thus an L-PSN can have many variations and the decisions to design a specific implementation of the L-PSN is generally based on the specific design or engineering objectives such as layout, speed and ease of software to handle routing, etc.

It can be readily determined, for one skilled in the art, that the embodiments of FIG. 2A through FIG. 4C illustrated various between two levels of conductors in a new L-PSN with (L+2) levels of conductors where generically any $D_S[i]$ number of conductors of the (i−1)-th level of conductors, which meet the requirements of either a $D_S[i]$-tuple or a W-$D_S[i]$-tuple described above, selectively couple to at least (Q+1) conductors of each of the D[i] sets of conductors of the i-th level of conductors through $(D_S[i]+Q)$ number of switches; more specifically, with $D_S[i]$ number of conductors meeting the $D_S[i]$-tuple definition, the $D_S[i]$-tuple selectively couple to one of the (Q+1) number of conductors in each of the D[i] sets of conductors through a respective $D_S[i]$ number of switches and each of Q number of conductors of the $D_S[i]$-tuple selectively couples to a respective conductor in each of the D[i] sets of conductors through a respective switch.

It is readily clear, for one skilled in the art, that the schemes described in this application has $D_S[i]$ number of conductors of the (i−1)-th level of conductors selectively couple to at least (Q+1) conductors of each of the D[i] sets of conductors of the i-th level of conductors through $(D_S[i]+Q)$ number of switches (or alternatively the $I_{i-1}$ number of conductors selectively couple the $I_i$ number of conductors through $(I_{i-1}\times D[i]+I_i\times Q)$ number of switches) for Q selected from $[1:(I_{j-1}-D_S[j]-1)]$ meeting the PSN-(A) and PSN-(B) formulations.

Figure 5A:
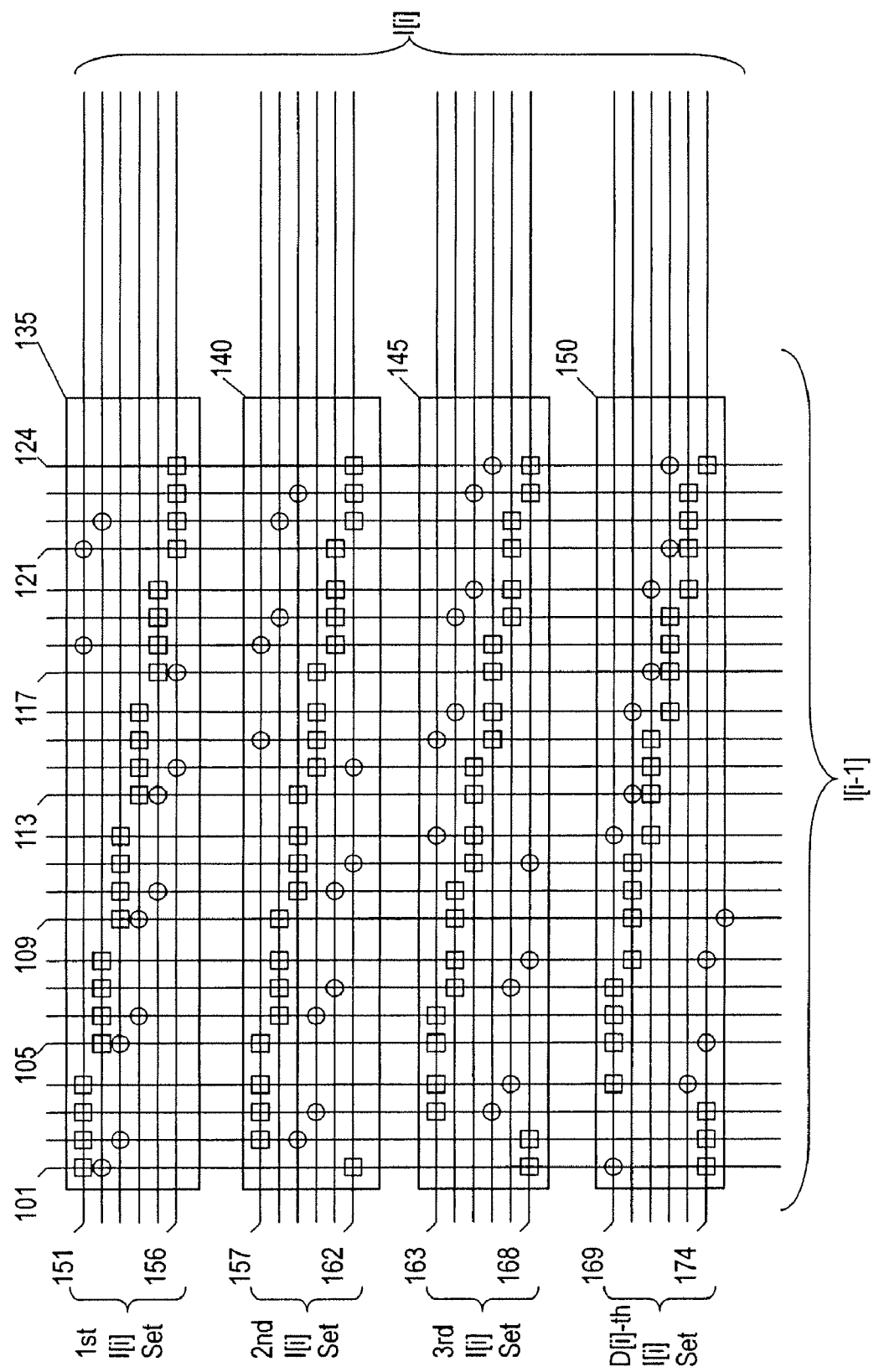
FIG. 5A illustrates one embodiment of the L-PSN of switch couplings between the (i−1)-th and the i-th levels of conductors with L>0, $I_{i-1}=I_i$ and $D[i]=D_S[i]$ for Q=2 and an i selected from [1:L+1].
Figure 5B:
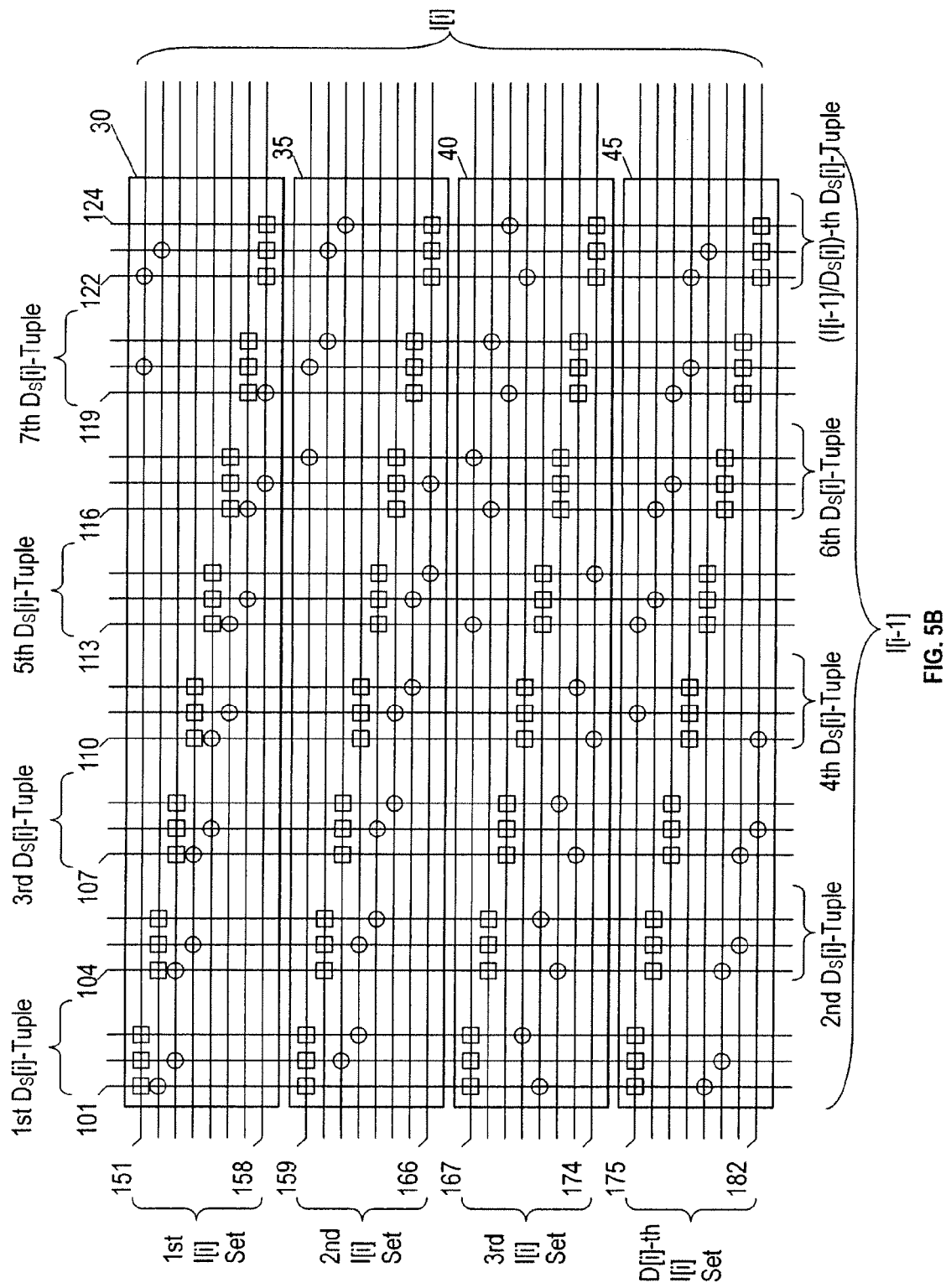
FIG. 5B illustrates another embodiment of the L-PSN of switch couplings between the (i−1)-th and the i-th levels of conductors with L>0, with $I_{i-1}=24$, $I_i=32$, $D[i]=4$ and $D_S[i]=3$ for Q=2 and an i selected from [1:L+1].

The embodiment of FIG. 5A illustrates an example where Q=2 for $I_{i-1}=I_i=24$ and $D[i]=D_S[i]=4$ with the $I_{i-1}$ number of conductors selectively couple the $I_i$ number of conductors through $((I_{i-1}\times D[i])+(I_i\times Q))=144$ switches; while the embodiment of FIG. 5B illustrates an example where Q=2 for $I_{i-1}=24$, $I_i=32$, $D[i]=4$, $D_S[i]=3$ with the $I_{i-1}$ number of conductors selectively couple the $I_i$ number of conductors through $((I_{i-1}\times D[i])+(I_i\times Q))=160$ switches.

For the case where $I_{i-1}=I_i$, as illustrated in the embodiment of FIG. 5A, there is a special case implementation of the new L-PSN conforming to the PSN-(A) and PSN-(B) formulations where each conductor of the $I_i$ number of conductors selectively couples (D[i]+Q) number of conductors of the $I_{i-1}$ number of conductors through (D[i]+Q) number of switches and each conductor of the $I_{i-1}$ number of conductors selectively couples to (D[i]+Q) number of conductors of the $I_i$ number of conductors through (D[i]+Q) number of switches.

It is readily obvious for one skilled in the art that most of the various embodiments illustrated so far illustrate the switch couplings between two levels of conductors; switch couplings between consecutive numbers of multiple levels of conductors can be constructed, with either the new schemes, the conventional schemes or a combination of schemes discussed in this application.

The L-PSN switching networks can be used in conjunction with other interconnection mechanisms to form an interconnection fabric, for programmable logic circuits such as Field Programmable Gate Arrays (FPGAs) or used in a general interconnection network such as a network router. When an L-PSN is too small, there is no appreciable advantage, in terms of switch count, compared with many alternative interconnection schemes of many conventional designs; for a 1-PSN, for example, both D[1] and D[L+1] should be at least three; for an L-PSN, at least one of the D[i] should be greater than two and $D_S[i]$ in general should be at least two where L is greater than one.

Thus the L-PSN scheme can be used to enhance the selective connectivity or routability of a netlist compared to a corresponding conventional L-PSN when there are one or more multicasting signals without adding more switches or conductors to the switching network. Using numerous embodiments and illustrations, a detailed description in building various enhanced multistage permutable switching networks is provided and used in various combinations to provide interconnect, both for inputs and outputs, for programmable logic circuits.

Thus, some embodiments of permutable switching network have been described. It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An integrated circuit, comprising: a L-level permutable switching network (L-PSN);
    wherein the L-PSN comprises an 0-th level of $I_0$ number of conductors selectively coupling a (L+1)-th level of $I_{L+1}$ number of conductors through L levels of conductors and (L+1) sets of switches for L≧1:
        wherein the L levels of conductors comprises:
            i-th level of conductors of $I_i$ number of conductors comprising D[i] sets of conductors and $I_{i-1} \leq I_i$ for each i selected from [1:L], wherein $(I_i/D[i])>1$, D[i]>1, and at least one j selected from [1:L] with D[j]>2;
        wherein $(I[0]/\Pi_{i=[1:L]}D[i])>1$;
        wherein the I[L+1] number of conductors comprises D[L+1] sets of conductors where D[L+1]>2,
            wherein each of the D[L+1] sets of conductors comprises $\Pi_{i=[1:L]}D[i]$ number of conductors;
        wherein the (L+1) sets of switches comprise at least $\Sigma_{i=[1:L+1]}(I_{i-1}\times D[i])$ number of switches,
            wherein each i-th set of the (L+1) sets of switches comprises at least $(I_{i-1}\times D[i])$ number of switches for i=[1:L+1];
    wherein the $I_{i-1}$ number of conductors of the (i–1)-th level of conductors selectively couple to $(I_i/D[i])$ number of conductors in each of the D[i] sets of conductors of the i-th level of conductors through a respective at least $I_{i-1}$ number of switches of the i-th set of switches for i=[1:L+1] without requiring traversal of any other conductors;
    wherein the $\Pi_{i=[1:L]}D[i]$ number of conductors in each of the D[L+1] sets of conductors of the (L+1)-th level of conductors are physically connected to a corresponding number of pins of a corresponding module selected from switching networks and logic cells; and
    at least one j selected from [1:L+1],
        wherein D[j] is at least two,
            wherein each conductor of the $I_{j-1}$ number of conductors of the (j–1)-th level of conductors selectively couples to at least (D[j]+1) number of conductors of the $I_j$ number of conductors of the j-th level of conductors through correspondingly at least (D[j]+1) number of switches without requiring traversal of any other conductors,
            wherein the (D[j]+1) number of conductors comprises at least one conductor selected from each of the D[j] sets of conductors of the $I_j$ number of conductors, and
            wherein the $I_{j-1}$ number of conductors selectively couple to the $I_j$ number of conductors through at least $(I_{j-1}\times D[j]+I_j)$ number of switches without requiring traversal of any other conductors.

2. The integrated circuit of claim 1, wherein for $D_S[j]=((I_{j-1}/I_j)\times D[j])$, $D_S[j]$ is at least two and a Q selected from $[1:(I_{j-1}-D_S[j]-1)]$, and wherein each conductor of the $I_{j-1}$ number of conductors selectively couples to (D[j]+Q) number of conductors selected at least one conductor from each of the D[j] sets of conductors of the $I_j$ number of conductors through (D[j]+Q) number of switches without requiring traversal of any other conductors.

3. The integrated circuit of claim 2, wherein the $I_{j-1}$ number of conductors selectively couple to the conductors in each set of the D[j] sets of conductors of the $I_j$ number of conductors through at least $((I_{j-1}+(I_j/D[j])\times Q)$ number of switches with a total of at least $(I_{j-1}\times D[j]+I_j\times Q)$ number of switches without requiring traversal of any other conductors.

4. A method of manufacturing an integrated circuit, comprising a L-level permutable switching network (L-PSN), the method comprising:
    0-th level of $I_0$ number of conductors selectively coupling a (L+1)-th level of $I_{L+1}$ number of conductors through L levels of conductors and (L+1) sets of switches for L≧1,
        wherein the L levels of conductors comprises:
            i-th level of conductors of $I_i$ number of conductors comprising D[i] sets of conductors and $I_{i-1}\leq I_i$ for each i selected from [1:L], wherein $(I_i/D[i])>1$, D[i]>1, and at least one j selected from [1:L] with D[j]>2;
        wherein $(I[0]/\Pi_{i=[1:L]}D[i])>1$;
        wherein the I[L+1] number of conductors comprises D[L+1] sets of conductors where D[L+1]>2;
            wherein each of the D[L+1] sets of conductors comprises $\Pi_{i=[1:L]}D[i]$ number of conductors;
        wherein the (L+1) sets of switches comprise at least $\Sigma_{i=[1:L+1]}(I_{i-1}\times D[i])$ number of switches,
            wherein each i-th set of the (L+1) sets of switches comprises at least $(I_{i-1}\times D[i])$ number of switches for i=[1:L+1];

the $I_{i-1}$ number of conductors of the (i−1)-th level of conductors selectively coupling to ($I_i$/D[i]) number of conductors in each of the D[i] sets of conductors of the i-th level of conductors through a respective at least $I_{i-1}$ number of switches of the i-th set of switches for i=[1: L+1] without requiring traversal of any other conductors;

physically connecting the $\Pi_{i=[1:L]}$D[i] number of conductors in each of the D[L+1] sets of conductors of the (L+1)-th level of conductors to a corresponding number of pins of a corresponding module selected from switching networks and logic cells; and at least one j selected from [1:L+1], wherein D[j] is at least two; and selectively coupling each conductor of the $I_{j-1}$ number of conductors of the (j−1)-th level of conductors to at least (D[j]+1) number of conductors of the $I_j$ number of conductors of the j-th level of conductors through correspondingly at least (D[j]+1) number of switches without requiring traversal of any other conductors, wherein the (D[j]+1) number of conductors comprises at least one conductor selected from each of the D[j] sets of conductors of the $I_j$ number of conductors; and selectively coupling the $I_{j-1}$ number of conductors to the $I_j$ number of conductors through at least ($I_{j-1}$×D[j]+$I_j$) number of switches without requiring traversal of any other conductors.

5. The method of claim 4, wherein for $D_S$[j]=(($I_{j-1}$/$I_j$)×D[j]), $D_S$[j] is at least two and a Q selected from [1:($I_{j-1}$−$D_S$[j]−1)], and wherein each conductor of the $I_{j-1}$ number of conductors selectively couples to (D[j]+Q) number of conductors selected at least one conductor from each of the D[j] sets of conductors of the $I_j$ number of conductors through (D[j]+Q) number of switches without requiring traversal of any other conductors.

6. The method of claim 5, further comprising selectively coupling the $I_{j-1}$ number of conductors to the conductors in each set of the D[j] sets of conductors of the $I_j$ number of conductors through at least (($I_{j-1}$+($I_j$/D[j]))×Q) number of switches with a total of at least ($I_{j-1}$×D[j]+$I_j$×Q) number of switches without requiring traversal of any other conductors.

7. A non-transitory machine readable medium that stores date representing an integrated circuit layout comprising a L-level permutable switching network (L-PSN), that when executed by a machine causes the machine to perform the following comprising:

0-th level of $I_0$ number of conductors selectively coupling a (L+1)-th level of $I_{L+1}$ number of conductors through L levels of conductors and (L+1) sets of switches for L≧1, wherein the L levels of conductors comprises:

i-th level of conductors of $I_i$ number of conductors comprising D[i] sets of conductors and $I_{i-1}$≦$I_i$ for each i selected from [1:L], wherein ($I_i$/D[i])>1, D[i]>1, and at least one j selected from [1:L] with D[j]>2;

wherein (I[0]/$\Pi_{i=[1:L]}$D[i])>1;
wherein the I[L+1] number of conductors comprises D[L+1] sets of conductors where D[L+1]>2;
wherein each of the D[L+1] sets of conductors comprises $\Pi_{i=[1:L]}$D[i] number of conductors;
wherein the (L+1) sets of switches comprise at least $\Sigma_{i=[1:L+1]}$×D[i]) number of switches,
wherein each i-th set of the (L+1) sets of switches comprises at least ($I_{i-1}$×D[i]) number of switches for i=[1: L+1];

the $I_{i-1}$ number of conductors of the (i−1)-th level of conductors selectively coupling to ($I_i$/D[i]) number of conductors in each of the D[i] sets of conductors of the i-th level of conductors through a respective at least $I_{i-1}$ number of switches of the i-th set of switches for i=[1: L+1] without requiring traversal of any other conductors;

physically connecting the $\Pi_{i=[1:L]}$D[i] number of conductors in each of the D[L+1] sets of conductors of the (L+1)-th level of conductors to a corresponding number of pins of a corresponding module selected from switching networks and logic cells; and at least one j selected from [1:L+1], wherein D[j] is at least two; and selectively coupling each conductor of the $I_{j-1}$ number of conductors of the (j−1)-th level of conductors to at least (D[j]+1) number of conductors of the $I_j$ number of conductors of the j-th level of conductors through correspondingly at least (D[j]+1) number of switches without requiring traversal of any other conductors, wherein the (D[j]+1) number of conductors comprises at least one conductor selected from each of the D[j] sets of conductors of the $I_j$ number of conductors; and selectively coupling the $I_{j-1}$ number of conductors to the $I_j$ number of conductors through at least ($I_{j-1}$×D[j]+$I_j$) number of switches without requiring traversal of any other conductors.

8. The non-transitory machine readable medium of claim 7, wherein for $D_S$[j]=(($I_{j-1}$/$I_j$)×D[j]), $D_S$[j] is at least two and a Q selected from [1:($I_{j-1}$−$D_S$[j]−1)], and wherein each conductor of the $I_{j-1}$ number of conductors selectively couples to (D[j]+Q) number of conductors selected at least one conductor from each of the D[j] sets of conductors of the $I_j$ number of conductors through (D[j]+Q) number of switches without requiring traversal of any other conductors.

9. The non-transitory machine readable medium of claim 8, wherein the machine is further caused to perform the following comprising selectively coupling the $I_{j-1}$ number of conductors to the conductors in each set of the D[j] sets of conductors of the $I_j$ number of conductors through at least (($I_{j-1}$+($I_j$/D[j]))×Q) number of switches with a total of at least ($I_{j-1}$×D[j]+$I_j$×Q) number of switches without requiring traversal of any other conductors.

* * * * *